US012813150B2

(12) United States Patent
Ryu et al.

(10) Patent No.: US 12,813,150 B2
(45) Date of Patent: Nov. 24, 2026

(54) DISPLAY DEVICE

(71) Applicant: Samsung Display Co., LTD., Yongin-si (KR)

(72) Inventors: Youn Joo Ryu, Yongin-si (KR); Jae Hun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 204 days.

(21) Appl. No.: 18/915,607

(22) Filed: Oct. 15, 2024

(65) Prior Publication Data

US 2025/0311603 A1 Oct. 2, 2025

(30) Foreign Application Priority Data

Mar. 29, 2024 (KR) ........................ 10-2024-0043080

(51) Int. Cl.
*H10K 59/80* (2023.01)

(52) U.S. Cl.
CPC ....... *H10K 59/8792* (2023.02); *H10K 59/873* (2023.02)

(58) Field of Classification Search
CPC ..... H10K 59/40; H10K 59/879; H10K 59/873
See application file for complete search history.

(56) References Cited

U.S. PATENT DOCUMENTS

2010/0271721 A1 10/2010 Gaides et al.
2022/0181412 A1* 6/2022 Kim ..................... G09G 3/2003
2023/0099374 A1* 3/2023 Hong ................... H10K 59/352 257/91
2023/0255088 A1* 8/2023 Hai .................... G06V 40/1318 257/40
2025/0151589 A1 5/2025 Lee et al.

FOREIGN PATENT DOCUMENTS

KR 100472893 B1 3/2005
KR 1020180084333 A 7/2018
KR 20200081911 A * 7/2020 ........... H10K 59/805
KR 1020210092351 A 7/2021
KR 20250064768 A 5/2025

* cited by examiner

*Primary Examiner* — Mariceli Santiago
(74) *Attorney, Agent, or Firm* — CANTOR COLBURN LLP

(57) ABSTRACT

A display device includes, a substrate, an emission material layer disposed on the substrate and including a plurality of light-emitting elements, and a light control layer disposed on the emission material layer. The light control layer includes, a bottom light-transmitting film disposed on the emission material layer, a first light-transmitting layer disposed on the bottom light-transmitting film, and a first light-shielding layer disposed on the first light-transmitting layer and including a plurality of light-shielding patterns spaced apart from one another. An end of the first light-transmitting layer coincides with an end of the bottom light-transmitting film or is disposed further to inside than the end of the bottom light-transmitting film.

20 Claims, 12 Drawing Sheets

DISPLAY DEVICE

This application claims priority to Korean Patent Application No. 10-2024-0043080, filed on Mar. 29, 2024, and all the benefits accruing therefrom under 35 U.S.C. § 119, the content of which in its entirety is herein incorporated by reference.

BACKGROUND

1. Field

The disclosure relates to a display device.

2. Description of the Related Art

As the information-oriented society evolves, various demands for display devices are ever increasing. Display devices may be a liquid-crystal display device, a field emission display device, a light-emitting display device, or the like. Light-emitting display devices may include an organic light-emitting display device including organic light-emitting diodes as light-emitting elements, an inorganic light-emitting display device including inorganic light-emitting diodes as light-emitting elements, etc.

For a vehicle with a display device, images displayed on the display device placed in front of a driver or a passenger may be projected on the windshield at night. When this happens, such images may hinder the driver's view. Accordingly, it is desired to control the viewing angle of the images displayed on the display device for vehicles. In addition, in order to protect privacy, it is desired to control the viewing angle of the images displayed on the display device for vehicles so that the images displayed on the display device placed in front of the driver is not seen by passengers.

SUMMARY

Features of the disclosure provide a display device that prevents overflow of a light-transmitting film.

It should be noted that features of the disclosure are not limited to the above-mentioned feature; and other features of the disclosure will be apparent to those skilled in the art from the following descriptions.

In an embodiment of the disclosure, there is provided a display device including, a substrate, an emission material layer disposed on the substrate and including a plurality of light-emitting elements, and a light control layer disposed on the emission material layer, where the light control layer includes, a bottom light-transmitting film disposed on the emission material layer, a first light-transmitting layer disposed on the bottom light-transmitting film, and a first light-shielding layer disposed on the first light-transmitting layer and including a plurality of light-shielding patterns spaced apart from one another, and where an end of the first light-transmitting layer coincides with an end of the bottom light-transmitting film or is disposed further to inside than the end of the bottom light-transmitting film.

In an embodiment, the end of the first light-transmitting layer does not further protrude outward than the end of the bottom light-transmitting film.

In an embodiment, the display device may further include, a second light-transmitting layer disposed on the first light-shielding layer, a second light-shielding layer disposed on the second light-transmitting layer and including a plurality of light-shielding patterns spaced apart from one another, and a first stopper disposed under at least a portion of the second light-transmitting layer and spaced apart from the plurality of light-shielding patterns, where an end of the second light-transmitting layer coincides with an end of the first stopper or is disposed further to inside than the end of the first stopper.

In an embodiment, the end of the second light-transmitting layer further protrudes outward than the end of the first light-transmitting layer.

In an embodiment, the end of the second light-transmitting layer does not further protrude outward than the end of the first stopper.

In an embodiment, the first stopper includes a same material as that of the second light-shielding layer.

In an embodiment, the display device may further include, a light-transmitting film dam spaced apart from the end of the bottom light-transmitting film and including a same material as that of the bottom light-transmitting film.

In an embodiment, the first stopper overlaps at least a portion of the light-transmitting film dam.

In an embodiment, the first stopper is disposed further to inside than the light-transmitting film dam.

In an embodiment, the first stopper does not overlap with the light-transmitting film dam.

In an embodiment, an outer boundary of the end of the first stopper coincides with an outer boundary of the end of the bottom light-transmitting film.

In an embodiment, the display device may further include, an intermediate layer disposed under the bottom light-transmitting film, where the intermediate layer includes or consists of an inorganic material.

In an embodiment, the display device may further include, an encapsulation dam disposed under the bottom light-transmitting film.

In an embodiment of the disclosure, there is provided a display device including, a substrate, an emission material layer disposed on the substrate and including a plurality of light-emitting elements, and a light control layer disposed on the emission material layer, where the light control layer includes, a first bottom light-transmitting film disposed on the emission material layer, a first light-transmitting layer disposed on the first bottom light-transmitting film, a first light-shielding layer disposed on the first light-transmitting layer and including a plurality of light-shielding patterns spaced apart from one another, a second bottom light-transmitting film disposed on the first light-shielding layer, a second light-transmitting layer disposed on the second bottom light-transmitting film, and a second light-shielding layer disposed on the second light-transmitting layer and including a plurality of light-shielding patterns spaced apart from one another, where an end of the first light-transmitting layer coincides with an end of the first bottom light-transmitting film or is disposed further to inside than the end of the first bottom light-transmitting film, and where an end of the second light-transmitting layer coincides with an end of the second bottom light-transmitting film or is disposed further to inside than the end of the second bottom light-transmitting film.

In an embodiment, the end of the first light-transmitting layer does not further protrude outward than the end of the first bottom light-transmitting lower film, and where the end of the second light-transmitting layer does not further protrude outward than the end of the second bottom light-transmitting film.

In an embodiment, the display device may further include, a first light-transmitting film dam spaced apart from one side of the end of the first bottom light-transmitting film, and a second light-transmitting film dam spaced apart from one side of the first light-transmitting film dam, where the second light-transmitting film dam includes a first sub-dam and a second sub-dam disposed on the first sub-dam, where the first light-transmitting film dam and the first sub-dam of the second light-transmitting film dam include a same material as that of the first bottom light-transmitting film, and where the second sub-dam of the second light-transmitting film dam includes a same material as that of the second bottom light-transmitting film.

In an embodiment, the display device may further include, a first dummy disposed between the first light-transmitting film dam and the second light-transmitting film dam, where the first dummy includes a same material as that of the second bottom light-transmitting film.

In an embodiment, the second bottom light-transmitting film overlaps at least a portion of the first light-transmitting film dam.

In an embodiment, the display device may further include, a first intermediate layer disposed under the first bottom light-transmitting film, and a second intermediate layer disposed between the second bottom light-transmitting film and the first light-transmitting layer, where the first intermediate layer and the second intermediate layer include an inorganic material.

In an embodiment, the display device may further include, an encapsulation dam disposed under the bottom light-transmitting film.

By an embodiment of the disclosure, it is possible to prevent overflow of a light-transmitting film.

It should be noted that effects of the disclosure are not limited to those described above and other effects of the disclosure will be apparent to those skilled in the art from the following descriptions.

BRIEF DESCRIPTION OF THE DRAWINGS

The above and other advantages and features of the disclosure will become more apparent by describing in detail embodiments thereof with reference to the attached drawings, in which.

DETAILED DESCRIPTION

Figure 1:
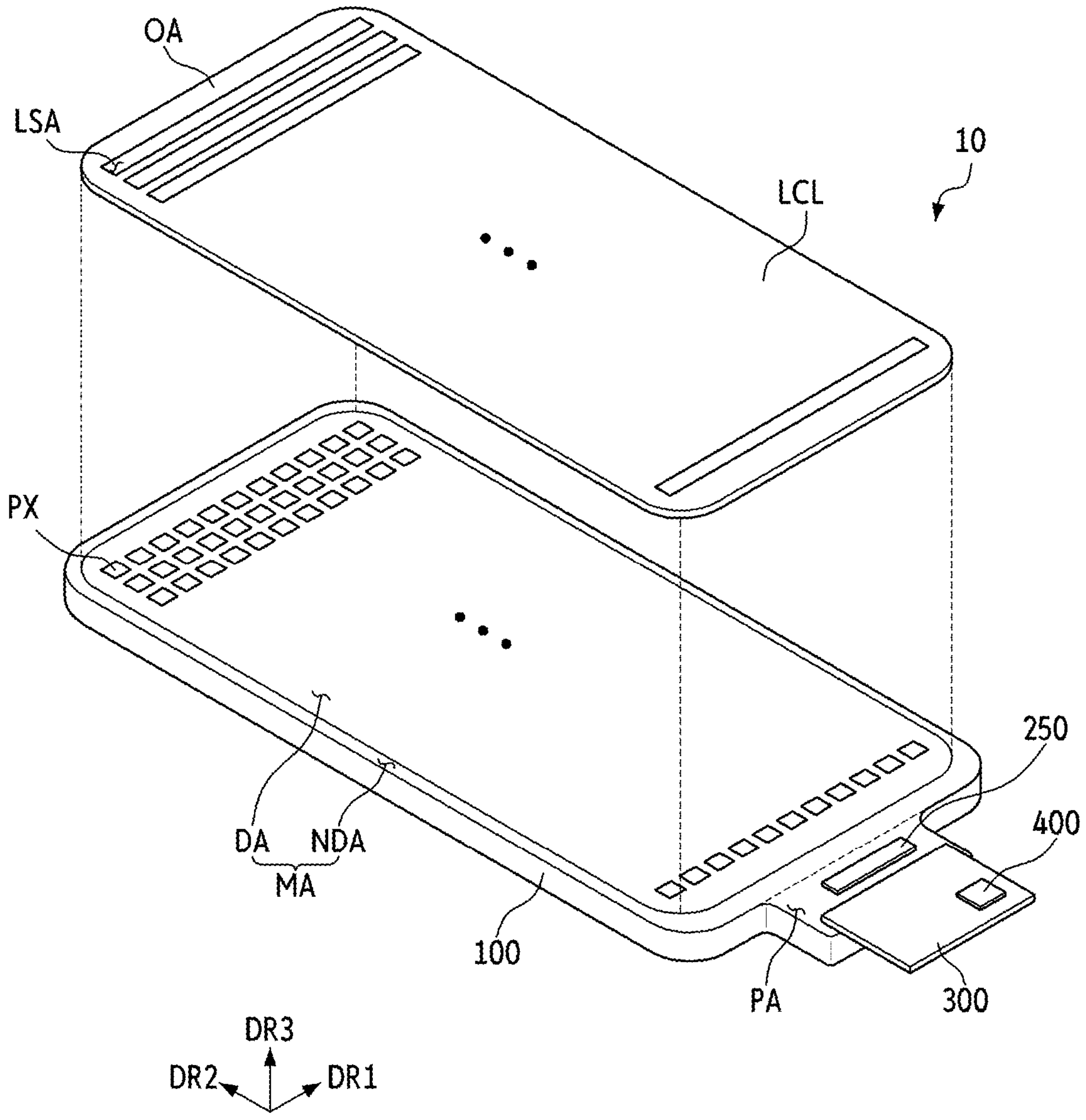
FIG. 1 is a perspective view showing an embodiment of a display device according to the disclosure.

Embodiments of the disclosure will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it may be directly on the other layer or substrate, or intervening layers may also be present. The same reference numbers indicate the same components throughout the specification.

It will be understood that, although the terms "first," "second," "third" etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments of the disclosure will be described in detail with reference to the accompanying drawings.

Figure 2:
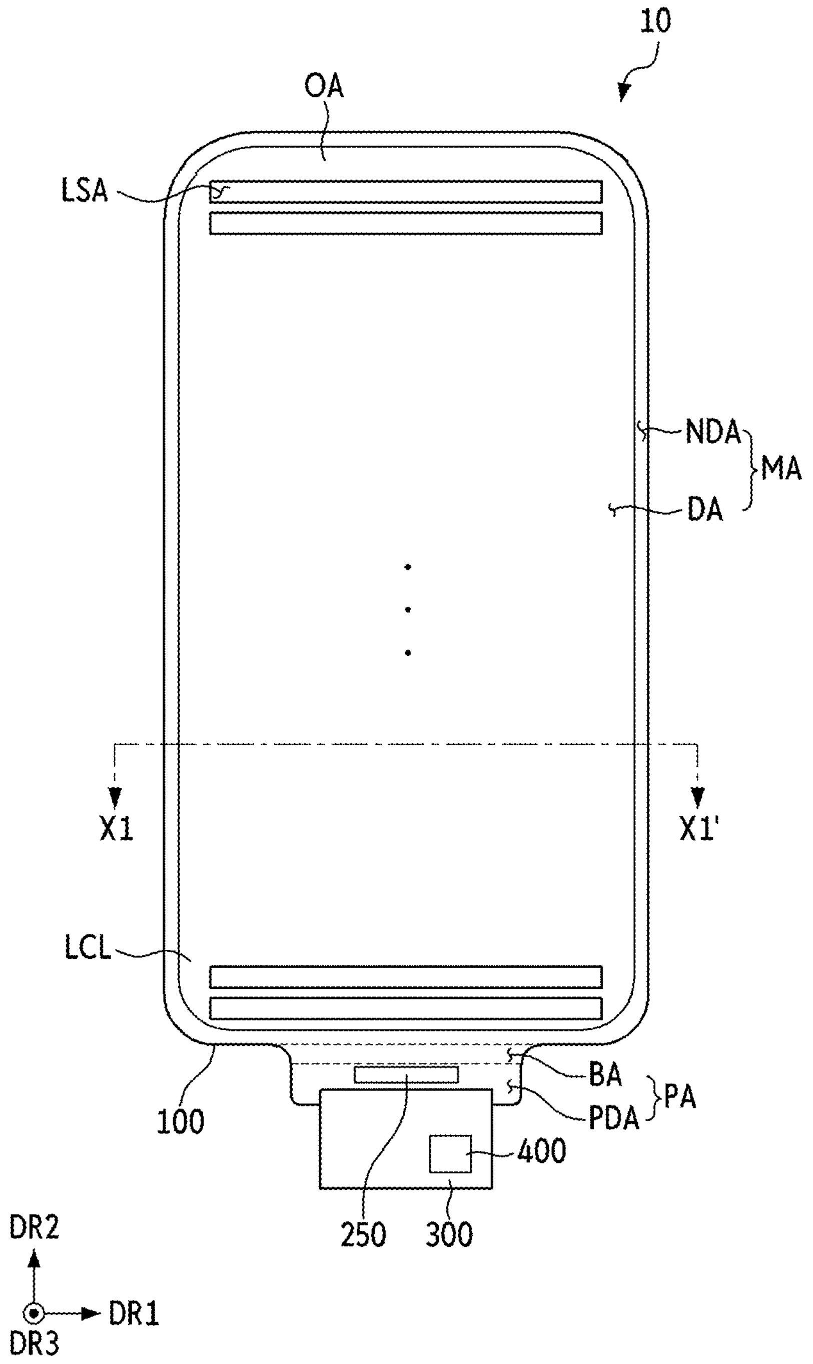
FIG. 2 is a plan view showing an embodiment of a display device according to the disclosure.

FIG. 1 is a perspective view showing an embodiment of a display device according to the disclosure. FIG. 2 is a plan view showing an embodiment of a display device according to the disclosure.

Referring to FIGS. 1 to 2, a display device 10 is for displaying moving images or still images. The display device 10 may be used as the display screen of portable electronic devices such as a mobile phone, a smart phone, a tablet personal computer ("PC"), a smart watch, a watch phone, a mobile communications terminal, an electronic notebook, an electronic book, a portable multimedia player ("PMP"), a navigation device and a ultra mobile PC ("UMPC"), as well as the display screen of various products such as an automobile, a television, a laptop computer, a monitor, a billboard and the Internet of Things ("IoT").

In some embodiments where the display device 10 is used as a display screen of a vehicle, the display device 10 may be an in-vehicle display. The in-vehicle display may provide a user with a variety of service information such as convenience functions and media information as well as drive information and status information of the vehicle. When the display device 10 includes an input device such as a touch panel, a user may manipulate a variety of features, such as the drive modes of the vehicle and the convenience functions, through the display device 10.

The display device 10 may be one of an organic light-emitting display device, a liquid-crystal display device, a plasma display device, a field emission display device, an electrophoretic display device, an electrowetting display device, a quantum dot light-emitting display device, a micro light-emitting diode ("LED") display device or the like. In the following description, an organic light-emitting display device is described in an embodiment of the display device 10. It is, however, to be understood that the disclosure is not limited thereto.

In an embodiment of the disclosure, the display device 10 may include a display panel 100, a display driving circuit 250, a circuit board 300 and a touch driving circuit 400.

The display panel 100 may include a plurality of pixels PX disposed in a first direction DR1 and a second direction DR2. Each of the pixels PX may have a quadrangular, e.g., rectangular, square, or diamond shape when viewed from the top. In an embodiment, each of the pixels PX may have a square shape when viewed from the top, as shown in the drawings, for example. It is, however, to be understood that the disclosure is not limited thereto. Each of the pixels PX may have a variety of shapes such as polygonal, circular, and oval shape when viewed from the top.

In the drawings, the first direction DR1 and the second direction DR2 intersect each other as the horizontal directions. In an embodiment, the first direction DR1 and the second direction DR2 may be perpendicular to each other, for example. In addition, a third direction DR3 may intersect the first direction DR1 and the second direction DR2, and may be a vertical direction, for example. Herein, the side indicated by the arrow of each of the first to third directions DR1, DR2 and DR3 in the drawings may be also referred to as a first side, while the opposite side may be also referred to as a second side. Unless stated otherwise, each of the first to third directions DR1, DR2 and DR3 may encompass the opposite sides. Herein, the side indicated by the arrow of each of the first to third directions DR1, DR2 and DR3 may be also referred to as a first side, while the opposite side may be also referred to as a side opposite side unless specifically state otherwise. As used herein, the terms "on," "upper side," "above," "top" and "upper surface" refer to the side indicated by the arrow of the third direction DR3 as shown in the drawings. The terms "under," "lower side," "below," "bottom" and "lower surface" refer to the opposite side indicated by the arrow of the third direction DR3 as shown in the drawings.

The display panel 100 may include a main area MA and a protruding area PA protruding from one side of the main area MA.

The main area MA may be formed in a quadrangular, e.g., rectangular plane having shorter sides in the first direction DR1 and longer sides in the second direction DR2 intersecting the first direction DR1. Each of the corners where the shorter side in the first direction DR1 meets the longer side in the second direction DR2 may be rounded with a predetermined curvature or may be a right angle. The shape of the display device 10 when viewed from the top is not limited to a quadrangular shape, but may be formed in another polygonal shape, circular shape, or elliptical shape. The main area MA may be, but is not limited to being, formed to be flat. The main area MA may include curved portions formed at left and right ends thereof. The curved portions may have a constant curvature or varying curvatures.

The main area MA may include a display area DA where pixels are formed to display images, and a non-display area NDA around the display area DA.

In addition to the pixels, scan lines, data lines, and power lines connected to the pixels may be disposed in the display area DA. When the main area MA includes a curved portion, the display area DA may be disposed on the curved portion. In such case, images of the display panel 100 may also be seen on the curved portion.

The non-display area NDA may be defined as the area from the outer side of the display area DA to the edge of the display panel 100. In the non-display area NDA, a scan driver for applying scan signals to scan lines, and link lines connecting the data lines with the display driving circuit 250 may be disposed.

The protruding area PA may protrude from one side of the main area MA. In an embodiment, the protruding area PA may protrude from the lower side of the main area MA as shown in FIG. 2, for example. The length of the protruding area PA in the first direction DR1 may be smaller than the length of the main area MA in the first direction DR1.

The protruding area PA may include a bending area BA and a pad area PDA. In such case, the pad area PDA may be disposed on one side of the bending area BA, and the main area MA may be disposed on the opposite side of the bending area BA. In an embodiment, the pad area PDA may be disposed on the lower side of the bending area BA, and the main area MA may be disposed on the upper side of the bending area BA, for example.

The display panel 100 may be flexible so that it may be curved, bent, folded or rolled. Therefore, the display panel 100 may be bent at the bending area BA in the third direction DR3, i.e., the thickness direction. In such case, the surface of the pad area PDA of the display panel 100 faces upward before the display panel 100 is bent, while the surface of the pad area PDA of the display panel 100 faces downward after the display panel 100 is bent. As a result, since the pad area PDA is disposed under the main area MA, it may overlap the main area MA.

Pads electrically connected to the display driving circuit 250 and the circuit board 300 may be disposed in the pad area PDA of the display panel 100.

The display driving circuit 250 outputs signals and voltages for driving the display panel 100. In an embodiment, the display driving circuit 250 may apply data voltages to the data lines. In addition, the display driving circuit 250 may apply supply voltage to the power line and may apply scan control signals to the scan driver, for example. The display driving circuit 250 may be implemented as an integrated circuit ("IC") and may be attached to the display panel 100 in a pad area PDA by a chip on glass ("COG") technique, a chip on plastic ("COP") technique, or an ultrasonic bonding. In an embodiment, the display driving circuit 250 may be disposed (e.g., mounted) on the circuit board 300, for example.

The pads may include display pads electrically connected to the display driving circuit 250 and touch pads electrically connected to touch lines.

The circuit board 300 may be attached to the pads using an anisotropic conductive film. In this manner, the lead lines of the circuit board 300 may be electrically connected to the pads. The circuit board 300 may be a flexible printed circuit board, a printed circuit board, or a flexible film such as a chip-on film.

The driving circuit 400 touch may be connected to touch electrodes of a touch sensor layer TSU (refer to FIG. 3) of the display panel 100. The touch driving circuit 400 applies driving signals to the touch electrodes of the touch sensor layer TSU (refer to FIG. 3) and measures capacitances of the touch electrodes. The driving signals may have driving pulses. The touch driving circuit 400 may not only determine whether a touch is input based on the capacitances, but also calculate touch coordinates of the position where the touch is input.

The touch driving circuit 400 may be disposed on the circuit board 300. The touch driving circuit 400 may be implemented as an IC and may be disposed (e.g., mounted) on the circuit board 300.

According to this embodiment, the display panel 100 of the display device 10 may further include a light control layer LCL.

The light control layer LCL may be disposed directly on the main area MA of the display panel 100. In an embodiment, the light control layer LCL may be incorporated into the display panel 100 and may be disposed directly in the main area MA of the display panel 100, for example. As the light control layer LCL is incorporated into the display panel 100, the thickness and the fabrication cost of the display device 10 may be advantageously reduced compared to a display device in which a separate light control film is attached.

In some embodiments, the light control layer LCL may be disposed on the display area DA of the main area MA. The light control layer LCL may adjust the viewing angle of light emitted from an emissive layer 172 (refer to FIG. 5) of the display panel 100.

It should be understood, however, that the embodiments of the disclosure are not limited thereto. The size of the light control layer LCL may be larger than the size of the display area DA when viewed from the top. In this instance, the light control layer LCL may overlap both the display area DA and the non-display area NDA.

In some embodiments, the light control layer LCL may include an open area OA and a light-shielding area LSA.

In the open area OA, no light-shielding film LS (refer to FIG. 6) may be disposed. The open area OA may transmit light and may be extended in the third direction DR3.

The open area OA may have a quadrangular shape, e.g., rectangular shape when viewed from the top as shown in FIGS. 1 and 2, but the disclosure is not limited thereto. The open area OA may have a circular, oval, or polygonal shape when viewed from the top. In some embodiments, the shape of the open area OA may generally conform to the shape of the display panel 100.

The light-shielding areas LSA may be the remaining areas of the light control layer LCL excluding the open area OA. In the light-shielding areas LSA, a light-shielding film LS (refer to FIG. 6) may be disposed.

In some embodiments, the light-shielding areas LSA may be extended in the first direction DR1 or the second direction DR2. In an embodiment, the light-shielding areas LSA may be extended in the first direction DR1 and arranged in the second direction DR2 as shown in FIG. 1, for example. In another embodiment, the light-shielding areas LSA may be extended in the second direction DR2 and arranged in the first direction DR1. In another embodiment, some of the light-shielding areas LSA may be extended in the first direction DR1 and may be arranged in the second direction DR2, and some others of the light-shielding areas LSA may be extended in the second direction DR2 and may be arranged in the first direction DR1.

According to the embodiment of FIG. 1 where the light-shielding areas LSA are arranged in the second direction DR2, the viewing angle may be controlled in the second direction DR2. In another embodiment where the light-shielding areas LSA are arranged in the first direction DR1, the viewing angle may be controlled in the first direction DR1. In the display device 10 according to this embodiment, the arrangement and shape of the open area OA and the light-shielding areas LSA may be changed in a variety of ways depending on the desired viewing angle control directions.

Although the open area OA surrounds the light-shielding areas LSA in the drawings, the disclosure is not limited thereto. In some embodiments, the open area OA may include a plurality of open areas OA, and the plurality of open areas OA may be extended in the same direction as the light-shielding areas LSA, such that the open areas OA and the light-shielding areas LSA may be disposed alternately. In an embodiment, when the light-shielding areas LSA are extended in the first direction DR1 as shown in FIG. 1, the plurality of open areas OA may be extended in the first direction DR1 and may be defined alternately with the light-shielding areas LSA in the second direction DR2, for example.

The light control layer LCL may include a light-shielding film LS (refer to FIG. 6) that blocks light emitted from an emissive layer 172 (refer to FIG. 5) of the display panel 100, and a light-transmitting film LT (refer to FIG. 6) that transmits the light. The structure of the light control layer LCL will be described later in detail with reference to FIG. 6 or the like.

Figure 3:
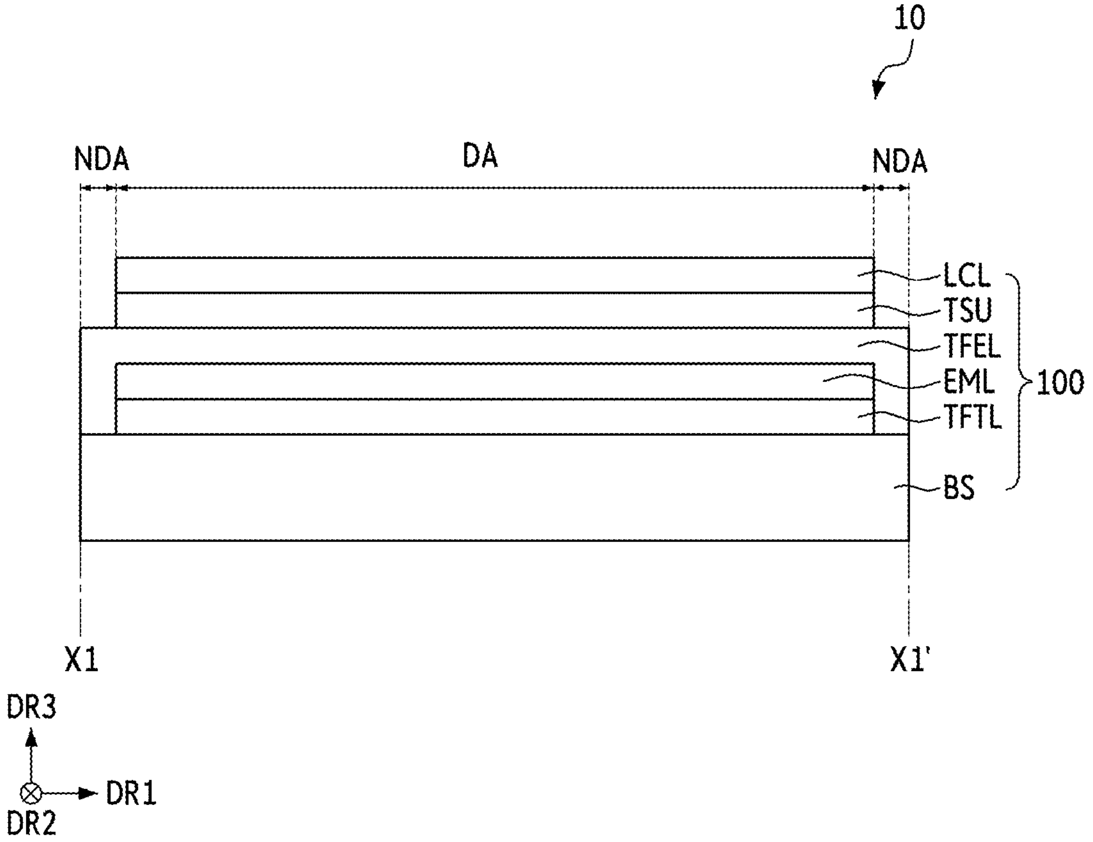
FIG. 3 is a cross-sectional view of a display device taken along line X1-X1' of FIG. 2.

FIG. 3 is a cross-sectional view of a display device taken along line X1-X1' of FIG. 2.

Referring to FIG. 3, the display device 10 may include the display panel 100 in which the light control layer LCL is incorporated. The display panel 100 may include a base member BS, a thin-film transistor layer TFTL, an emission material layer EML a thin-film encapsulation layer TFEL, a touch sensor layer TSU, and a light control layer LCL.

The base member BS may include a substrate. The substrate may include or consist of an insulating material such as glass, quartz and polymer resin. In an embodiment, the polymer material may include polyethersulphone ("PES"), polyacrylate ("PA"), polyacrylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate, cellulose triacetate ("CAT"), cellulose acetate propionate ("CAP") or any combinations thereof. In an alternative embodiment, the substrate may include a metallic material.

The substrate may be a rigid substrate or a flexible substrate that may be bent, folded, rolled, and so on. When the substrate is a flexible substrate, it may include or consist of, but is not limited to, PI.

The thin-film transistor layer TFTL may be disposed on the base member BS. On the thin-film transistor layer TFTL, scan lines, data lines, power supply lines, scan control lines, routing lines connecting the pads with the data lines may be formed as well as thin-film transistors in the pixels. Each of the thin-film transistors may include a gate electrode, a semiconductor layer, a source electrode and a drain electrode.

The thin-film transistor layer TFTL may be disposed in the display area DA and the non-display area NDA. Specifically, the thin-film transistors in the pixels, the scan lines, the data lines, and the power supply lines on the thin-film transistor layer TFTL may be disposed in the display area DA. The scan control lines and the link lines on the thin-film transistor layer TFTL may be disposed in the non-display area NDA.

The emission material layer EML may be disposed on the thin-film transistor layer TFTL. The emission material layer (also referred to as a light-emitting element layer) EML may include pixels including a first electrode, an emissive layer and a second electrode, and a pixel-defining layer. The emissive layer may be an organic emissive layer including or consisting of an organic material. Then, the emissive layer may include a hole transporting layer, an organic light-emitting layer and an electron transporting layer. When a voltage is applied to the first electrode and a cathode voltage is applied to the second electrode through the thin-film transistor on the thin-film transistor layer TFTL, the holes and electrons move to the organic light-emitting layer through the hole transporting layer and the electron transporting layer, respectively, such that they combine in the organic light-emitting layer to emit light. The pixels on the emission material layer EML may be disposed in the display area DA.

The thin-film encapsulation layer TFEL may be disposed on the emission material layer EML. The thin-film encapsulation layer TFEL may prevent oxygen or moisture from permeating into the emission material layer EML. To this end, a thin-film encapsulation layer TFEL may include at least one inorganic layer. The inorganic layer may be, but not limited to, a silicon nitride layer, a silicon oxynitride layer, a silicon oxide layer, a titanium oxide layer, or an aluminum oxide layer. In addition, the thin-film encapsulation layer TFEL may protect the emission material layer EML from foreign substances such as dust. To this end, the thin-film encapsulation layer TFEL may include at least one organic layer. The organic layer may include or consist of, but is not limited to, an acryl resin, an epoxy resin, a phenolic resin, a polyamide resin and a PI resin.

The thin-film encapsulation layer TFEL may be disposed in the display area DA as well as the non-display area NDA. Specifically, the thin-film encapsulation layer TFEL may cover the display area DA and the emission material layer EML and may cover the thin-film transistor layer TFTL in the non-display area NDA.

The touch sensor layer TSU may be disposed on the thin-film encapsulation layer TFEL. As the touch sensor layer TSU is disposed directly on the thin-film encapsulation layer TFEL, the thickness of the display device 10 may be reduced, compared with a display device in which a separate touch panel including the touch sensor layer TSU is attached on the thin-film encapsulation layer TFEL.

The touch sensor layer TSU may include touch electrodes for sensing a user's touch by capacitive sensing, and touch lines for connecting the pads with the touch electrodes. In an embodiment, the touch sensor layer TSU may sense a user's touch by self-capacitance sensing or mutual capacitance sensing, for example.

The touch electrodes of the touch sensor layer TSU may be disposed in a touch sensor area overlapping with the display area DA. The touch lines of the touch sensor layer TSU may be disposed in a touch peripheral area overlapping with the non-display area NDA.

The light control layer LCL may be disposed on the touch sensor layer TSU. The light control layer LCL may be disposed such that it overlaps the display area DA. The light control layer LCL may absorb or block some of the lights that are emitted from the emission material layer EML and travel out of a predetermined angle with respect to the third direction DR3. That is to say, the light control layer LCL may control the viewing angle.

Although not shown in the drawings, the display device 10 may further include a cover window. The cover window may be further disposed on the light control layer LCL. The light control layer LCL and the cover window may be attached together by a transparent adhesive member such as an optically clear adhesive ("OCA") film.

Figure 4:
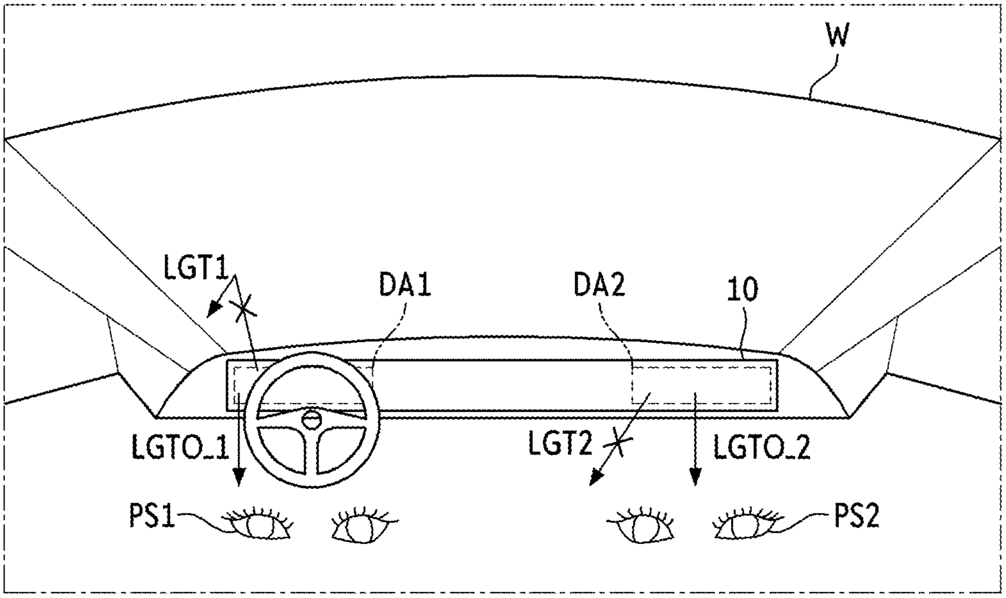
FIG. 4 is a view schematically showing an embodiment of a display device in an embodiment applied to a vehicle.

FIG. 4 is a view schematically showing an embodiment of a display device applied to a vehicle.

Referring to FIG. 4, a display device 10 in an embodiment may be applied to a vehicle, for example. The vehicle may include a body that forms the exterior of the vehicle, and an interior space defined by the body. The body may include a windshield W that protects a driver PS1 and a passenger PS2 from the outside and allows the driver PS1 to see through it. The display device 10 may be provided in the interior space as shown in the drawing.

In some embodiments, the display device 10 may be placed on a dashboard provided in the interior space. In an embodiment, as shown in FIG. 4, the display device 10 may be extended from the dashboard disposed in front of the driver seat to the dashboard disposed in front of the passenger seat, for example. In an embodiment, the display device 10 may be a single large display connected from the dashboard disposed in front of the driver seat to the dashboard disposed in front of the passenger seat, for example.

In this instance, the display device 10 may include a first display area DA1 disposed in front of the driver seat and a second display area DA2 disposed in front of the passenger seat. The first display area DA1 may be placed on the dashboard in front of the driver seat and may provide speed information, etc., to the driver PS1, and the second display area DA2 may be placed on the dashboard in front of the passenger seat and may provide entertainment information, etc., to the passenger PS2. Although not shown in the drawings, a third display area may be further included between the first display area DA1 and the second display area DA2.

In another embodiment, the display device 10 may be placed on each of the dashboard in front of the driver seat and the dashboard in front of the passenger seat. In an embodiment, the first display device may be placed on the dashboard in front of the driver seat, and the second display device may be placed on the dashboard in front of the passenger seat, for example.

The driver PS1 may recognize (or see) images on the display screen of the display device 10 through a light LGT0_1 emitted from the display device 10 in front of the driver seat toward the driver PS1. Predetermined light LGT1 among the lights emitted from the display device 10 in front of the driver seat may be reflected off the windshield W and provided to the driver PS1. When this happens, the images projected on the windshield W may hinder the view of the driver PS1. In contrast, in the display device 10 in the embodiment, by adjusting the viewing angle on the front side (the side facing the driver PS1), especially the vertical viewing angle, of the lights emitted from the display device 10, it is possible to prevent predetermined light LGT1 emitted from the display device 10 in front of the driver seat from being reflected off the windshield W and provided to the driver PS1.

The passenger PS2 may recognize (or see) images on the display screen of the display device 10 through a light LGT0_2 emitted from the display device 10 in front of the passenger seat toward the passenger PS2. It should be noted that predetermined light LGT2 emitted from the display device 10 in front of the passenger seat may be provided toward the driver PS1. When this happens, the driver PS1 may be restricted from watching the display device 10 for reasons such as safety while driving. In the display device 10 in the embodiment, by adjusting the viewing angle on the front side (the side facing the passenger PS2), especially the horizontal viewing angle, of the lights emitted from the display device 10, it is possible to prevent predetermined light LGT2 emitted from the display device 10 in front of the passenger seat from being provided to the driver PS1.

Although the vertical viewing angle of the display device 10 in front of the driver seat is adjusted while the horizontal viewing angle of the display device 10 in front of the passenger seat is adjusted in the drawing, the disclosure is not limited thereto. In an embodiment, the horizontal viewing angle of the display device 10 in front of the driver seat may be adjusted while the vertical viewing angle of the display device 10 in front of the passenger seat may be adjusted, for example. In another embodiment, the vertical viewing angle as well as the horizontal viewing angle of each of the display device 10 in front of the driver seat and the display device 10 in front of the passenger seat may be adjusted.

The viewing angle may be adjusted through the light control layer LCL. The viewing angle may be limited to a predetermined angle range through the light control layer LCL. In an embodiment, the viewing angle may be equal to or less than 35° from the normal that is an imaginary line facing the driver PS1 or the passenger PS2 and extended in a direction perpendicular to the display surface of the display device 10, for example. In some embodiments, an angle equal to or less than 35° from the normal may be defined as the effective viewing angle, but the disclosure is not limited thereto.

Figure 5:
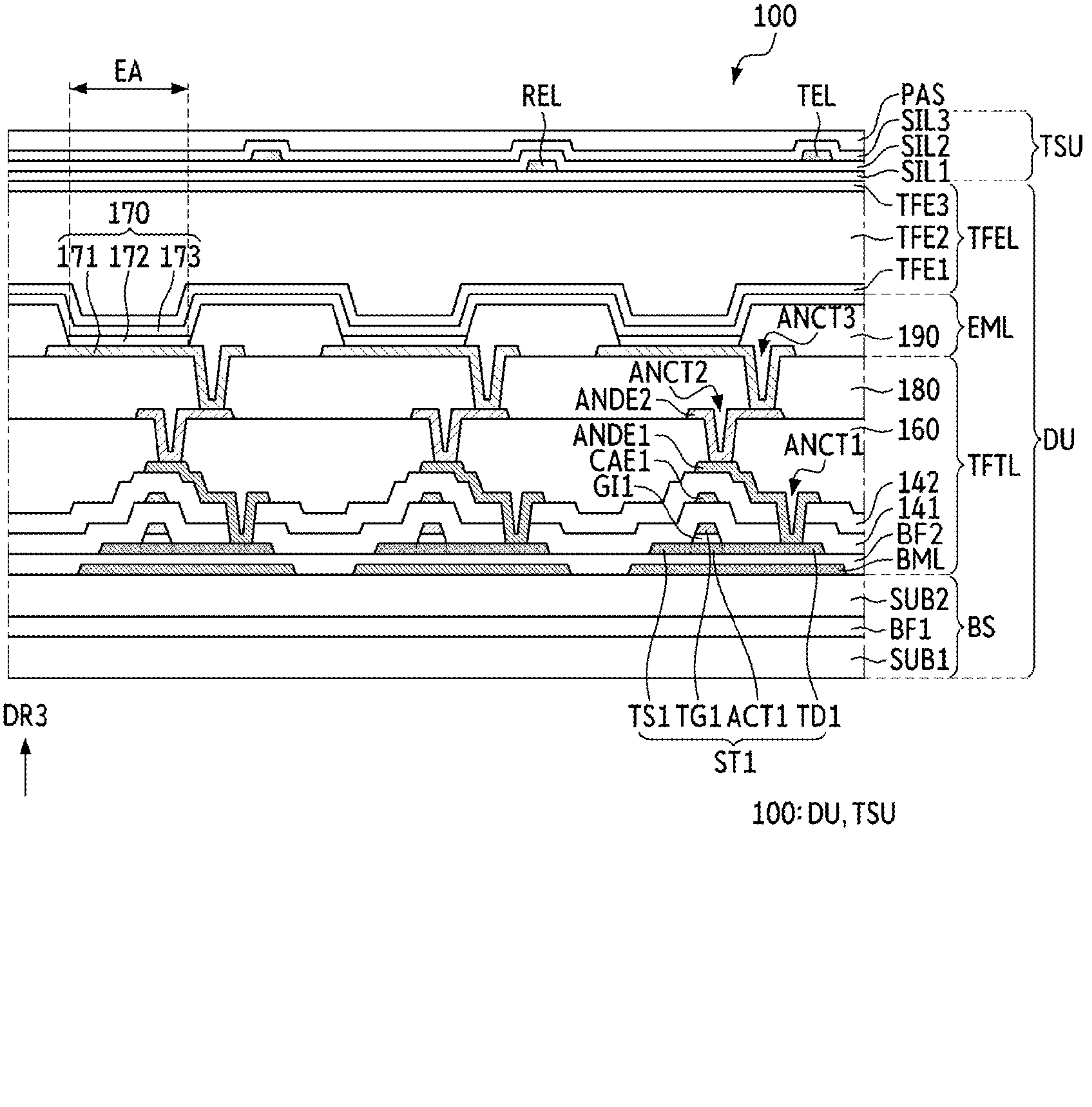
FIG. 5 is a cross-sectional view showing an embodiment of a display panel according to the disclosure.

FIG. 5 is a cross-sectional view showing an embodiment of a display panel according to the disclosure.

Referring to FIG. 5, the display panel 100 may include a display layer DU and a touch sensor layer TSU. The display layer DU may include a base member BS, a thin-film transistor layer TFTL, an emission material layer EML and a thin-film encapsulation layer TFEL.

The base member BS may include a first substrate SUB1, a first buffer film BF1 disposed on the first substrate SUB1, and a second substrate SUB2 disposed on the first buffer film BF1.

The first substrate SUB1 and the second substrate SUB2 may include or consist of an insulating material such as glass, quartz and polymer resin. In an embodiment, the polymer material may include PES, PA, PAR, PEI, PEN, PET, PPS, polyallylate, PI, polycarbonate, CAT, CAP or any combinations thereof. In an alternative embodiment, the substrate may include a metallic material.

The first substrate SUB1 and the second substrate SUB2 may be a rigid substrate or a flexible substrate that may be bent, folded, rolled, and so on. When the substrate is a flexible substrate, it may include or consist of, but is not limited to, PI.

The first buffer film BF1 is a film for protecting a first thin-film transistor ST1 and the emissive layer 172 from moisture permeating through the first substrate SUB1 and the second substrate SUB2, which are vulnerable to permeation of moisture. The first buffer film BF1 may be made up of multiple inorganic films alternately stacked on one another. In an embodiment, the first buffer film BF1 may be made up of multiple films in which one or more inorganic films of a silicon nitride layer, a silicon oxynitride layer, a silicon oxide layer, a titanium oxide layer and an aluminum oxide layer are alternately stacked on one another, for example.

The thin-film transistor layer TFTL may include a bottom metal layer BML, a second buffer film BF2, a first thin-film transistor ST1, a first gate insulator GI1, a first inter-dielectric film 141, a first capacitor electrode CAE1, a second inter-insulating film 142, a first anode connection electrode ANDE1, a first organic film 160, a second anode connection electrode ANDE2, and a second organic film 180.

The bottom metal layer BML may be disposed on the second substrate SUB2. The bottom metal layer BML may overlap with a first active layer ACT1 of the first thin-film transistor ST1 in the third direction in order to prevent leakage current when the light is incident on the first active layer ACT1 of the first thin-film transistor ST1. The bottom metal layer BML may be made up of a single layer or multiple layers of one of molybdenum (Mo), aluminum (Al), chromium (Cr), gold (Au), titanium (Ti), nickel (Ni), neodymium (Nd) and copper (Cu) or any alloys thereof. The bottom metal layer BML may be eliminated.

The second buffer film BF2 may be disposed over the bottom metal layer BML. The second buffer film BF2 is a film for protecting a first thin-film transistor ST1 and an emissive layer 172 from moisture permeating through the first substrate SUB1 and the second substrate SUB2, which are vulnerable to moisture permeation. The second buffer film BF2 may be made up of multiple inorganic layers sequentially stacked on one another. In an embodiment, the second buffer film BF2 may be made up of multiple layers in which one or more inorganic layers of a silicon nitride layer, a silicon oxynitride layer, a silicon oxide layer, a titanium oxide layer and an aluminum oxide layer are alternately stacked on one another, for example.

The first active layer ACT1 of the first thin-film transistor ST1 may be disposed on the second buffer film (also referred to as a second buffer layer) BF2. The first active layer ACT1 of the first thin-film transistor ST1 includes polycrystalline silicon, monocrystalline silicon, low-temperature polycrystalline silicon, amorphous silicon, or oxide semiconductor. Since the first active layer ACT1 of the first thin-film transistor ST1 that is not covered by the first gate insulator (also referred to as a first gate insulating layer) GI1 but is exposed is doped with impurities or ions, it may have conductivity. Therefore, a first source electrode TS1 and a first drain electrode TD1 of the first active layer ACT1 of the first thin-film transistor ST1 may be formed.

The first gate insulator GI1 may be disposed on the first active layer ACT1 of the first thin-film transistor ST1. Although the first gate insulating layer GI1 is disposed between the first gate electrode TG1 and the first active layer ACT1 of the first thin-film transistor ST1 in the example shown in FIG. 6, the disclosure is not limited thereto. The first gate insulating layer GI1 may be disposed between the first inter-dielectric film (also referred to as a first inter-dielectric layer) 141 and the first active layer ACT1 and between the first inter-dielectric layer 141 and the second buffer layer BF2 as well. The first gate insulating layer GI1 may include or consist of an inorganic layer, e.g., a silicon nitride layer, a silicon oxynitride layer, a silicon oxide layer, a titanium oxide layer, or an aluminum oxide layer.

The first gate electrode TG1 of the first thin-film transistor ST1 may be disposed on the first gate insulating layer GI1. The first gate electrode TG1 of the first thin-film transistor ST1 may overlap the first active layer ACT1 in the third direction DR3. The first gate electrode TG1 of the first thin-film transistor ST1 may be made up of a single layer or multiple layers of one of molybdenum (Mo), aluminum (Al), chromium (Cr), gold (Au), titanium (Ti), nickel (Ni), neodymium (Nd) and copper (Cu) or any alloys thereof.

The first inter-dielectric layer 141 may be disposed on the first gate electrode TG1 of the first thin-film transistor ST1. The first inter-dielectric film 141 may include or consist of an inorganic layer, e.g., a silicon nitride layer, a silicon oxynitride layer, a silicon oxide layer, a titanium oxide layer, or an aluminum oxide layer. The first inter-dielectric film 141 may include a number of inorganic layers.

A first capacitor electrode CAE1 may be disposed on the first inter-dielectric layer 141. The first capacitor electrode CAE1 may overlap the first gate electrode TG1 of the first thin-film transistor ST1 in the third direction (z-axis direction). Since the first inter-dielectric layer 141 has a predetermined dielectric constant, a capacitor may be formed by the first capacitor electrode CAE1, the first gate electrode TG1, and the first inter-dielectric layer 141 disposed between them. The first capacitor electrode CAE1 may be made up of a single layer or multiple layers of one of molybdenum (Mo), aluminum (Al), chromium (Cr), gold (Au), titanium (Ti), nickel (Ni), neodymium (Nd) and copper (Cu) or any alloys thereof.

The second inter-insulating film (also referred to as a second inter-dielectric layer or a second inter-dielectric film) 142 may be disposed over the first capacitor electrode CAE1. The second inter-dielectric film 142 may include or consist of an inorganic layer, e.g., a silicon nitride layer, a silicon oxynitride layer, a silicon oxide layer, a titanium oxide layer, or an aluminum oxide layer. The second inter-dielectric film 142 may include a number of inorganic layers.

A first anode connection electrode ANDE1 may be disposed on the second inter-dielectric layer 142. The first anode connection electrode ANDE1 may be connected to a first drain electrode TD1 of the first thin-film transistor ST1 through a first anode contact hole ANCT1 that penetrates the first inter-dielectric layer 141 and the second inter-dielectric layer 142 to expose the first drain electrode TD1 of the first thin-film transistor ST1. The first anode connection electrode ANDE1 may be made up of a single layer or multiple layers of one of molybdenum (Mo), aluminum (Al), chromium (Cr), gold (Au), titanium (Ti), nickel (Ni), neodymium (Nd) and copper (Cu) or any alloys thereof.

The first organic film (also referred to as a first organic layer) 160 may be disposed on the first anode connection electrode ANDE1 for planarization. The first organic film 160 may be formed as an organic layer such as an acryl resin, an epoxy resin, a phenolic resin, a polyamide resin and a PI resin.

A second anode connection electrode ANDE2 may be disposed on the first organic layer 160. The second anode connection electrode ANDE2 may be connected to the second anode connection electrode ANDE2 through a second anode contact hole ANCT2 that penetrates through the first organic layer 160 to expose the first anode connection electrode ANDE1. The second anode connection electrode ANDE2 may be made up of a single layer or multiple layers of one of molybdenum (Mo), aluminum (Al), chromium (Cr), gold (Au), titanium (Ti), nickel (Ni), neodymium (Nd) and copper (Cu) or any alloys thereof.

The second organic film (also referred to as second organic layer) 180 may be disposed on the second anode connection electrode ANDE2. The second organic film 180 may be formed as an organic layer such as an acryl resin, an epoxy resin, a phenolic resin, a polyamide resin and a PI resin.

In FIG. 5, the first thin-film transistor ST1 is implemented as a top-gate transistor in which the first gate electrode TG1 is disposed above the first active layer ACT1. It is, however, to be understood that the disclosure is not limited thereto. The first thin-film transistor ST1 may be implemented as a bottom-gate transistor in which the first gate electrode TG1 is disposed below the first active layer ACT1, or as a double-gate transistor in which the first gate electrodes TG1 are disposed above and below the first active layer ACT1.

An emission material layer EML may be disposed on the second organic film 180. The emission material layer EML may include light-emitting elements 170 and a bank 190. Each of the light-emitting elements 170 may include a first light-emitting electrode 171, an emissive layer 172, and a second light-emitting electrode 173.

The first light-emitting electrode 171 may be formed on the second organic layer 180. The first light-emitting electrode 171 may be connected to the second anode connection electrode ANDE2 through a third anode contact hole ANCT3 that penetrates through the second organic layer 180 to expose the second anode connection electrode ANDE2.

The first light-emitting electrode 171 may be formed on the second organic layer 180. The first light-emitting electrode 171 may be connected to the second anode connection electrode ANDE2 through a third anode contact hole ANCT3 that penetrates through the second organic layer 180 to expose the second anode connection electrode ANDE2.

In the top-emission organic light-emitting diode that light exits from the emissive layer 172 toward the second light-emitting electrode 173, the first light-emitting electrode 171 may include or consist of a metal material having a relatively high reflectivity such as a stack structure of aluminum and titanium (Ti/Al/Ti), a stack structure of aluminum and indium tin oxide ("ITO") (ITO/Al/ITO), an silver palladium copper ("APC") alloy and a stack structure of APC alloy and ITO (ITO/APC/ITO). The APC alloy is an alloy of silver (Ag), palladium (Pd) and copper (Cu).

The bank 190 may partition the first light-emitting electrode 171 on the second organic layer 180 to serve to define an emission area EA. The bank 190 may define an opening that exposes at least a portion of an upper surface of the first light-emitting electrode 171. The bank 190 may be formed to cover edges of the first light-emitting electrode 171. The bank 190 may include or consist of an organic film such as an acryl resin, an epoxy resin, a phenolic resin, a polyamide resin and a PI resin.

In the emission area EA, the first light-emitting electrode 171, the emissive layer 172 and the second light-emitting electrode 173 are stacked on one another sequentially, so that holes from the first light-emitting electrode 171 and electrons from the second light-emitting electrode 173 are combined with each other in the emissive layer 172 to emit light. The emission area EA may be defined by the bank 190.

The emissive layer 172 is formed on the first light-emitting electrode 171 and the bank 190. The emissive layer 172 may be disposed in the opening of the bank 190, but the disclosure is not limited thereto. The emissive layer 172 may include an organic material to emit light of a predetermined color. In an embodiment, the emissive layer 172 may include a hole transporting layer, an organic material layer, and an electron transporting layer, for example.

The second light-emitting electrode 173 may be disposed on the emissive layer 172. The second light-emitting electrode 173 may be formed to cover the emissive layer 172. The second light-emitting electrode 173 may be a common layer formed across all of the emission areas EA. Although not shown in the drawings, a capping layer may be formed on the second light-emitting electrode 173 in some implementations.

In the top-emission structure, the second light-emitting electrode 173 may include or consist of a transparent conductive oxide ("TCO") such as ITO and indium zinc oxide ("IZO") that may transmit light, or a semi-transmissive conductive material such as magnesium (Mg), silver (Ag) and an alloy of magnesium (Mg) and silver (Ag). When the second light-emitting electrode 173 includes or consists of a semi-transmissive conductive material, the light extraction efficiency may be increased by microcavities.

The thin-film encapsulation layer TFEL may be disposed on the second light-emitting electrode 173. The thin-film encapsulation layer TFEL may include at least one inorganic film to prevent permeation of oxygen or moisture into the emission material layer. In addition, the thin-film encapsulation layer TFEL may include at least one organic layer to protect the emission material layer from particles such as dust. In an embodiment, the thin-film encapsulation layer TFEL may include a first encapsulation film TFE1, a second encapsulation film TFE2 and a third encapsulation film TFE3, for example.

The first encapsulation film TFE1 (e.g., a first inorganic encapsulation film) may be disposed on the second light-emitting electrode 173. The first encapsulation film TFE1 may be an inorganic film made up of a single layer or multiple layers. The first encapsulation film TFE1 may be made up of multiple films in which one or more inorganic films of a silicon nitride layer, a silicon oxynitride layer, a silicon oxide layer, a titanium oxide layer and an aluminum oxide layer are alternately stacked on one another, or a single film.

The second encapsulation film TFE2 (e.g., a first organic encapsulation film) may be disposed on the first encapsulation film TFE1. The second encapsulation film TFE2 may be an inorganic film made up of a single layer or multiple layers. The second encapsulation film (also referred to as a second encapsulation layer) TFE2 may include a polymer-based material. Such polymer-based material may include PET, PEN, polycarbonate, PI, polyethylene sulfonate, polyoxymethylene, polyarylate, hexamethyldisiloxane, acrylic resins (e.g., polymethyl methacrylate, polyacrylic acid, etc.) or any combination thereof.

The third encapsulation film TFE3 (e.g., a second inorganic encapsulation film) may be disposed on the second encapsulation film TFE2. The third encapsulation film TFE3 may be an inorganic film made up of a single layer or multiple layers. The third encapsulation film TFE3 may include the same material as that of the first encapsulation film TFE1. In an embodiment, the third encapsulation film TFE3 may be made up of multiple films in which one or more inorganic films of a silicon nitride layer, a silicon oxynitride layer, a silicon oxide layer, a titanium oxide layer and an aluminum oxide layer are alternately stacked on one another, or a single film, for example.

The touch sensor layer TSU may be disposed on the thin-film encapsulation layer TFEL. The touch sensor layer TSU may include a plurality of touch electrodes for sensing a user's touch by capacitive sensing, and touch lines connecting the plurality of touch electrodes with a touch driver. In an embodiment, the touch sensor layer TSU may sense a user's touch by mutual capacitance sensing or self-capacitance sensing, for example.

In another embodiment, the touch sensor layer TSU may be disposed on a separate substrate disposed on the display layer DU. In this instance, the substrate supporting the touch sensor layer TSU may be a sealing member sealing the display layer DU.

The plurality of touch electrodes of the touch sensor layer TSU may be disposed in the touch sensor area overlapping the display area. The touch lines of the touch sensor layer TSU may be disposed in the touch peripheral area overlapping the non-display area.

The touch sensor layer TSU may include a first touch insulating film SIL1, a first touch electrode REL, a second touch insulating film SIL2, a second touch electrode TEL, and a third touch insulating film SIL3.

The first touch insulating film SIL1 may be disposed on the thin-film encapsulation layer TFEL. The first touch insulating film SIL1 may have insulating properties and optical features. The first touch insulating film SIL1 may include at least one inorganic film. In an embodiment, the first touch insulating film SIL1 may be an inorganic layer including at least one selected from the group including: a silicon nitride layer, a silicon oxynitride layer, a silicon oxide layer, a titanium oxide layer and an aluminum oxide layer. Optionally, the first touch insulating film SIL1 may be eliminated, for example.

The first touch electrode REL may be disposed on the first touch insulating film SIL1. The first touch electrode REL may not overlap with the light-emitting elements 170. The first touch electrode REL may be made up of a single layer of molybdenum (Mo), titanium (Ti), copper (Cu), aluminum (Al), or ITO, or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The second touch insulating film SIL2 may cover the first touch electrodes REL and the first touch insulating film SIL1. The second touch insulating film SIL2 may have insulating properties and optical features. In an embodiment, the second touch insulating film SIL2 may include or consist of one of the above-listed materials as the material of the first touch insulating film (also referred to as a first touch insulating layer SIL1), for example.

The second touch electrodes TEL may be disposed on the second touch insulating film SIL2. The second touch electrodes TEL may not overlap with the light-emitting elements 170. The second touch electrodes TEL may be made up of a single layer of molybdenum (Mo), titanium (Ti), copper (Cu), aluminum (Al), or ITO, or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The third touch insulating film SIL3 may cover the second touch electrodes TEL and the second touch insulating film SIL2. The third touch insulating film SIL3 may have insulating properties and optical features. The third touch insulating film SIL3 may include or consist of one of the above-listed materials as the material of the second touch insulating film SIL2.

In some embodiments, the first touch insulating film SIL1, the second touch insulating film SIL2 and the third touch insulating film SIL3 may be organic films. In an embodiment, the first touch insulating film SIL1, the second touch insulating film SIL2 and the third touch insulating film SIL3 may be organic films such as an acrylic resin, an epoxy resin, a phenolic resin, a polyamide resin and a PI resin, for example.

The touch sensor layer TSU may further include a planarization film PAS for providing a flat surface. The planarization film PAS may include or consist of an organic layer such as an acryl resin, an epoxy resin, a phenolic resin, a polyamide resin and a PI resin.

Figure 6:
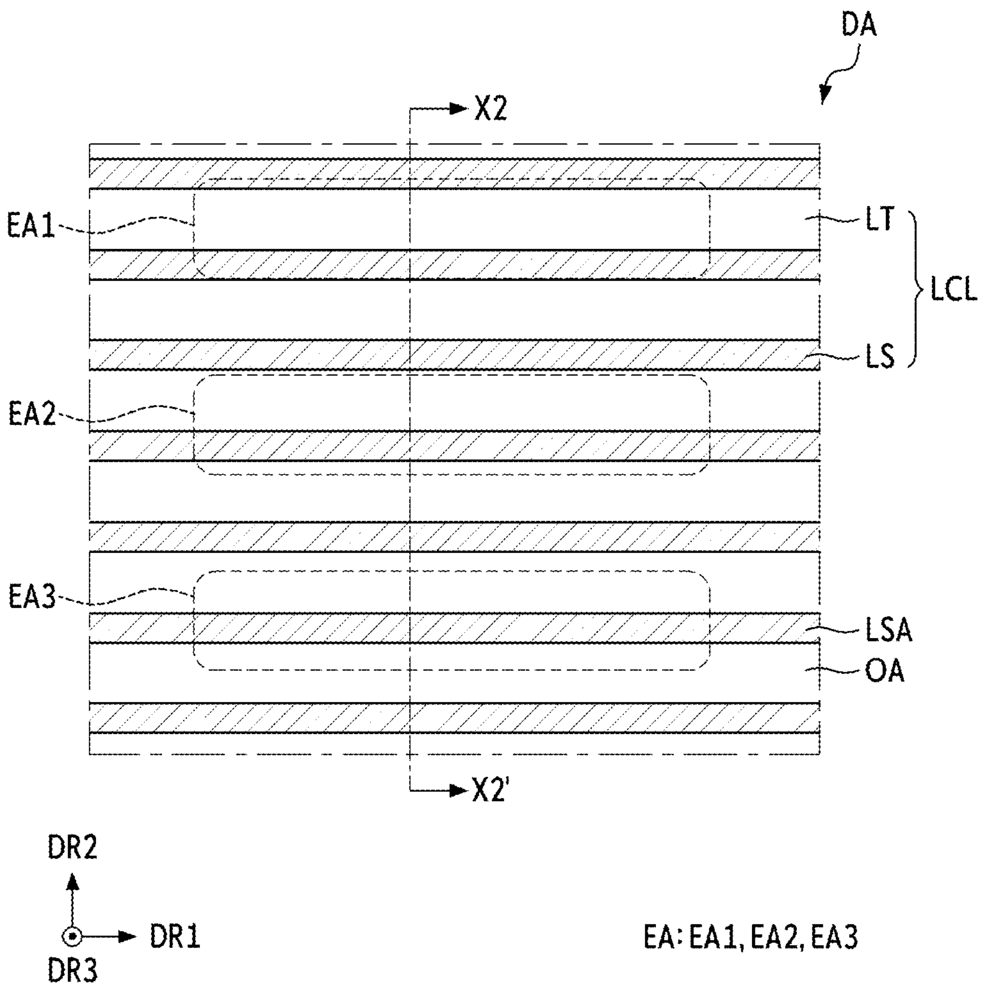
FIG. 6 is a plan view showing an embodiment of a portion of a display area according to the disclosure.
Figure 7:
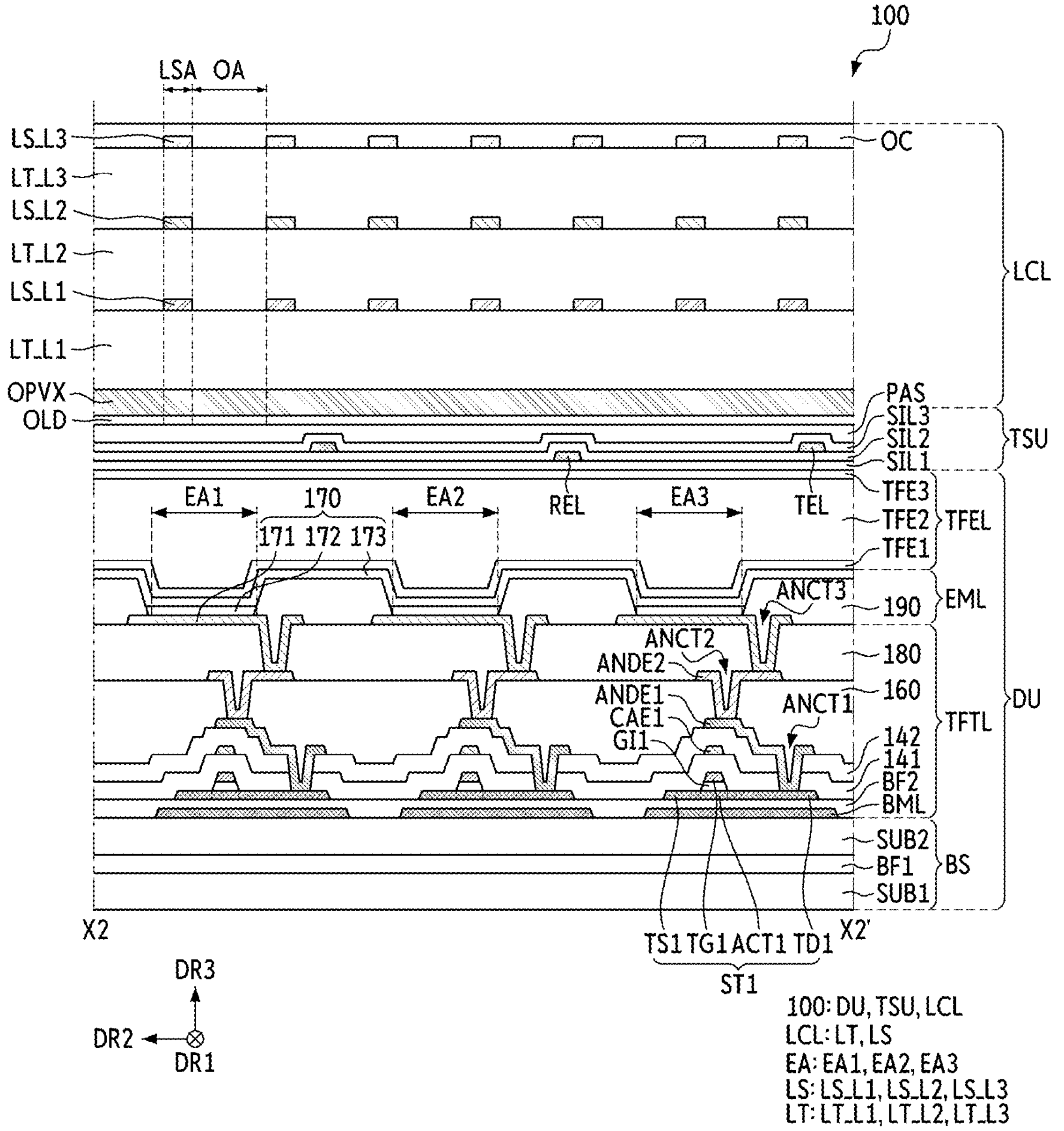
FIG. 7 is a cross-sectional view taken along line X2-X2' of FIG. 6.

FIG. 6 is a plan view showing an embodiment of a portion of a display area according to the disclosure. FIG. 7 is a cross-sectional view taken along line X2-X2' of FIG. 6.

Referring to FIGS. 6 and 7 in conjunction with FIGS. 1 and 2, the display area DA of the display device 10 may include a plurality of emission areas EA. In the emission areas EA, lights emitted by the light-emitting elements 170 may exit. The emission areas EA may be defined by the bank 190. In an embodiment, the plurality of emission areas EA may overlap with the emissive layer 172 disposed within the openings of the bank 190, for example. In the emission area EA, the first light-emitting electrode 171, the emissive layer 172, and the second light-emitting electrode 173 may overlap one another and may be sequentially stacked on one another.

In some embodiments, the plurality of emission areas EA may include a first emission area EA1, a second emission area EA2 and a third emission area EA3. Although three types of emission areas EA are included in the display area DA in the drawings, the disclosure is not limited thereto. More or less than three emission areas EA may be included.

The first emission area EA1 may emit light of a first color, the second emission area EA2 may emit light of a second color, and the third emission area EA3 may emit light of a third color. The light of the first color may be light of a red wavelength range, the light of the second color may be light of a green wavelength range, and the light of the third color may be light of a blue wavelength range. The red wavelength range may range approximately from 600 nanometers (nm) to 750 nm, the green wavelength range may range approximately from 480 nm to 560 nm, and the blue wavelength range may range approximately from 370 nm to 460 nm. It should be understood, however, that the embodiments of the disclosure are not limited thereto.

Each of the first to third emission areas EA1, EA2 and EA3 may have a quadrangular, e.g., rectangular, square, or diamond shape when viewed from the top. In an embodiment, each of the first to third emission areas EA1, EA2 and EA3 may have a quadrangular shape, e.g., rectangular shape with rounded corners as shown in the drawing, for example, but the disclosure is not limited thereto.

In an embodiment of the disclosure, the first to third emission areas EA1, EA2 and EA3 may have the same area. The first to third emission areas EA1, EA2 and EA3 may be extended in the first direction DR1 and may be disposed side by side in the second direction DR2.

In another embodiment of the disclosure, the first to third emission areas EA1, EA2 and EA3 may have different areas. The first to third emission areas EA1, EA2 and EA3 may be extended in the first direction DR1 and may be disposed side by side in the second direction DR2.

In the example shown in FIG. 6, the open area OA and the light-shielding areas LSA are extended in the first direction DR1, like the display device 10 in the embodiment of FIG. 1.

The emission areas EA of the display area DA may overlap with the open area OA and the light-shielding areas LSA in the third direction DR3. In an embodiment, the first to third emission areas EA1, EA2 and EA3 may overlap with the open area OA and the light-shielding areas LSA, for example.

In the open area OA, no light-shielding film LS of the light control layer LCL may be disposed. In the light-shielding areas LSA, the light-shielding film LS of the light control layer LCL may be disposed.

The light control layer LCL may be disposed on the display layer DU or the touch sensor layer TSU. The light control layer LCL may control the viewing angle of lights emitted from the emissive layer 172. In an embodiment, when light emitted from the emissive layer 172 travels at a predetermined angle or less with respect to the third direction DR3, the lights may exit to the outside, for example. When the lights emitted from the emissive layer 172 travel out of the predetermined angle with respect to the third direction DR3, the lights may be absorbed or blocked by the light-shielding film LS and cannot exit to the outside.

The light control layer LCL may include an intermediate layer OLD, a bottom light-transmitting film OPVX, light-transmitting film LT, and light-shielding film LS.

The intermediate layer OLD may be disposed on the display layer DU or the touch sensor layer TSU. The intermediate layer OLD may include a transparent inorganic material. In an embodiment, the intermediate layer OLD may include at least one of silicon oxide (SiOx), silicon nitride (SiNx), and silicon oxynitride (SiOxNy), for example.

The intermediate layer OLD may be disposed between the bottom light-transmitting film OPVX and the organic film to increase interface characteristics so that the bottom light-transmitting film OPVX may be easily deposited on the organic film during the deposition process of the bottom light-transmitting film OPVX. In an embodiment, when the bottom light-transmitting film OPVX is deposited directly on the organic film that has different interface properties from those of the bottom light-transmitting film OPVX, deposition particles may not be easily deposited on the organic film, for example. In contrast, when the intermediate layer OLD is disposed on the organic film, deposition particles of the bottom light-transmitting film OPVX may be easily deposited on the intermediate layer OLD.

The bottom light-transmitting film OPVX may be disposed on the intermediate layer OLD. The bottom light-transmitting film OPVX may transmit light emitted from the emissive layer 172. The bottom light-transmitting film OPVX may include a transparent organic material. In an embodiment, the bottom light-transmitting film OPVX may include an organic film such as an acryl resin, an epoxy resin, a phenolic resin, a polyamide resin and a PI resin, for example.

The light-transmitting film LT may transmit light emitted from the emissive layer 172. The light-transmitting film LT may include a transparent organic material. In an embodiment, the light-transmitting film LT may include an organic film such as an acryl resin, an epoxy resin, a phenolic resin, a polyamide resin and a PI resin, for example.

The light-transmitting film LT may be disposed in the open area OA. As shown in FIG. 6, the light-transmitting film LT may be disposed alternately with the light-shielding film LS in the first direction DR1 or the second direction DR2.

The light-shielding film LS may absorb or block lights emitted from the emissive layer 172. The light-shielding film LS may include a light-blocking organic material. In an embodiment, the light-shielding film LS may be a photosensitive resin capable of absorbing or blocking light, and may include an organic material including or consisting of an organic black pigment such as carbon black, for example.

The light-shielding film LS may be disposed in the light-shielding areas LSA. As shown in FIG. 6, the light-shielding film LS may be disposed alternately with the light-transmitting film LT in the first direction DR1 or the second direction DR2.

In some embodiments, the light-transmitting film LT may include a first light-transmitting layer LT_L1, a second light-transmitting layer LT_L2, and a third light-transmitting layer LT_L3. The light-shielding film LS may include a first light-shielding layer LS_L1, a second light-shielding layer LS_L2, and a third light-shielding layer LS_L3.

The first light-transmitting layer LT_L1 may be disposed on the bottom light-transmitting film OPVX. The first light-shielding layer LS_L1 may be disposed on the first light-transmitting layer LT_L1. The second light-transmitting layer LT_L2 may be disposed on the first light-shielding layer LS_L1 and the first light-transmitting layer LT_L1. The second light-shielding layer LS_L2 may be disposed on the second light-transmitting layer LT_L2. The third light-transmitting layer LT_L3 may be disposed on the second light-shielding layer LS_L2 and the second light-transmitting layer LT_L2. The third light-shielding layer LS_L3 may be disposed on the third light-transmitting layer LT_L3.

Each of the first light-shielding layer LS_L1, the second light-shielding layer LS_L2 and the third light-shielding layer LS_L3 may include a plurality of light-blocking patterns spaced apart from one another in the first direction DR1 or the second direction DR2. In an embodiment, when the light-shielding film LS is spaced apart in the second direction DR2 as shown in FIG. 6, the first light-shielding layer LS_L1, the second light-shielding layer LS_L2 and the third light-shielding layer LS_L3 may be spaced apart from one another in the second direction DR2, for example.

The display device 10 may further include an overcoat layer OC. The overcoat layer OC may be disposed on the third light-shielding layer LS_L3 and the third light-transmitting layer LT_L3. The overcoat layer OC may include an organic film such as an acryl resin, an epoxy resin, a phenolic resin, a polyamide resin and a PI resin.

In some embodiments, the light-transmitting film LT may be formed via an inkjet printing process. The bottom light-transmitting film OPVX may be formed by a deposition process or a photolithography process. The light-transmitting film LT may include a different material from the bottom light-transmitting film OPVX. In an embodiment, the light-transmitting film LT may include an ester-based compound and a phosphine oxide compound, for example. Specifically, the number of carbon atoms of the ester-based compound may be equal to or less than 30. The bottom light-transmitting film OPVX may include propylene glycol methyl ether acetate, methacrylic acid-benzylmethacrylic acid copolymer, multi-functional acrylate, and photo initiator.

In some embodiments, the overcoat layer OC may be formed via a deposition process or a photolithography process, similar to the bottom light-transmitting film OPVX. The overcoat layer OC may include propylene glycol methyl ether acetate, methacrylic acid-benzylmethacrylic acid copolymer, multi-functional acrylate, and photo initiator, like the bottom light-transmitting film OPVX.

Figure 8:
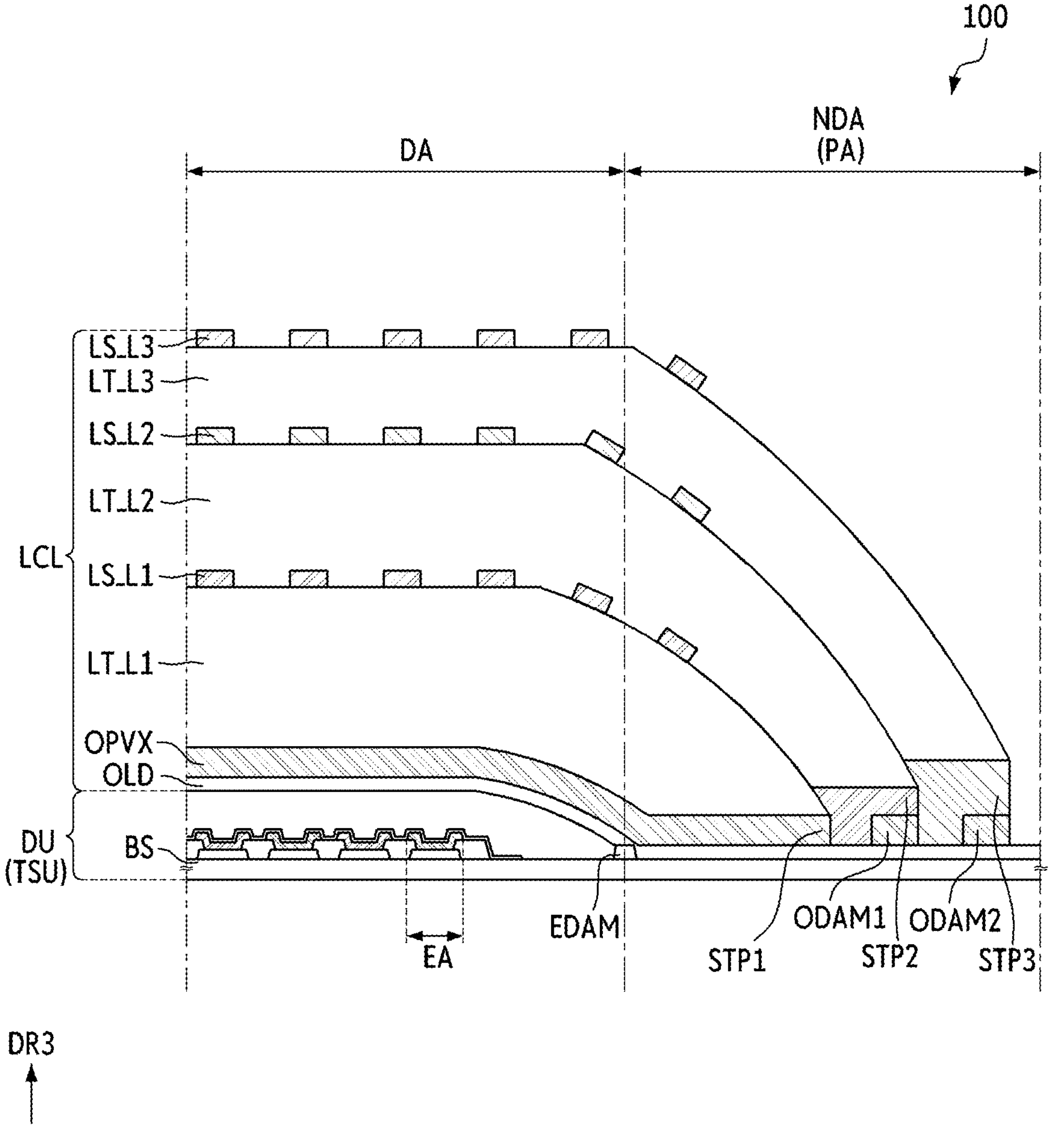
FIG. 8 is a cross-sectional view showing an embodiment of a display area, a non-display area, and a protruding area of a display panel.

FIG. 8 is a cross-sectional view showing an embodiment of a display area, a non-display area, and a protruding area of a display panel.

Referring to FIG. 8 in conjunction with FIGS. 1 and 7, the bottom light-transmitting film OPVX and the intermediate layer OLD may be extended not only to the display area DA but also to the non-display area NDA or the protruding area PA.

In some embodiments, one end of the intermediate layer OLD may be extended further toward the non-display area NDA or the protruding area PA from the display area DA than one end of the bottom light-transmitting film OPVX. That is to say, the end of the bottom light-transmitting film OPVX may be disposed closer to the display area DA than the end of the intermediate layer OLD. The end of the bottom light-transmitting film OPVX may be disposed closer to an encapsulation dam EDAM to be described later than the end of the intermediate layer OLD.

The first light-transmitting layer LT_L1, the second light-transmitting layer LT_L2 and the third light-transmitting layer LT_L3 may be extended not only to the display area DA but also to the non-display area NDA or the protruding area PA.

Although a plurality of light-shielding patterns of each of the first light-shielding layer LS_L1, the second light-shielding layer LS_L2 and the third light-shielding layer LS_L3 is also disposed in the non-display area NDA or the protruding area PA in the drawing, the disclosure is not limited thereto. In an embodiment, the plurality of light-shielding patterns of each of the first light-shielding layer LS_L1, the second light-shielding layer LS_L2 and the third light-shielding layer LS_L3 may be disposed only in the display area DA but not in the non-display area NDA or the protruding area PA, for example.

The display panel 100 may further include an encapsulation dam EDAM and light-transmitting film dams ODAM1 and ODAM2.

The encapsulation dam EDAM may be disposed further to the inside of the display panel 100 than the light-transmitting film dams ODAM1 and ODAM2. In an embodiment, the encapsulation dam EDAM may be disposed closer to the display area DA than the light-transmitting film dams ODAM1 and ODAM2, for example.

Although the encapsulation dam EDAM is disposed in the display area DA and the non-display area NDA and the light-transmitting film dams ODAM1 and ODAM2 are disposed in the non-display area NDA or the protruding area PA in the drawing, the disclosure is not limited thereto. In another embodiment, both the encapsulation dam EDAM and the light-transmitting film dams ODAM1 and ODAM2 may be disposed in the non-display area NDA or the protruding area PA, or both may be disposed in the display area DA.

The encapsulation dam EDAM may be disposed on the base member BS. The encapsulation dam EDAM may prevent the second encapsulation film TFE2 of the thin-film encapsulation layer TFEL from overflowing into the non-display area NDA or the outside. Although the display panel 100 includes one encapsulation dam EDAM in the drawing, the disclosure is not limited thereto. The display panel 100 may include two or more encapsulation dams EDAM.

The encapsulation dam EDAM may have a structure in which one or more layers are stacked on one another. In some embodiments, at least one layer of the encapsulation dam EDAM may include the same material as at least one of the first organic film 160, the second organic film 180 and the bank 190, and may be disposed in the same layer.

The light-transmitting film dams ODAM1 and ODAM2 may be disposed further to the outside of the display panel 100 than the encapsulation dam EDAM. In an embodiment, the light-transmitting film dams ODAM1 and ODAM2 may be disposed closer to the non-display area NDA or the protruding area PA than the encapsulation dam EDAM, for example. The light-transmitting film dams ODAM1 and ODAM2 may be disposed further to the outside than the end of the bottom light-transmitting film OPVX. In an embodiment, the light-transmitting film dams ODAM1 and ODAM2 may be disposed closer to the non-display area NDA or the protruding area PA than the end of the bottom light-transmitting film OPVX, for example.

The light-transmitting film dams ODAM1 and ODAM2 may be disposed on the intermediate layer OLD. The light-transmitting film dams ODAM1 and ODAM2 may prevent the light-transmitting film LT from overflowing into the non-display area NDA or the outside. In some embodiments, the light-transmitting film dams ODAM1 and ODAM2 may include a first light-transmitting film dam ODAM1 and a second light-transmitting film dam ODAM2. Although the display panel 100 includes two light-transmitting film dams ODAM1 and ODAM2 in the drawing, the disclosure is not limited thereto. The display panel 100 may include one or three or more light-transmitting film dams ODAM1 and ODAM2.

The light-transmitting film dams ODAM1 and ODAM2 may include the same material and may be disposed in the same layer as the bottom light-transmitting film OPVX. In an embodiment, the light-transmitting film dams ODAM1 and ODAM2 may include propylene glycol methyl ether acetate, methacrylic acid-benzylmethacrylic acid copolymer, multi-functional acrylate, and photo initiator, for example. The light-transmitting film dams ODAM1 and ODAM2 may be formed via the same process with the bottom light-transmitting film OPVX. In an embodiment, the light-transmitting film dams ODAM1 and ODAM2 may be formed via a deposition process or a photolithography process along with the bottom light-transmitting film OPVX, for example.

In some embodiments, one end of the bottom light-transmitting film OPVX, the first light-transmitting film dam ODAM1, and the second light-transmitting film dam ODAM2 may be spaced apart from one another.

According to this embodiment, the display device 10 may include stoppers STP1, STP2 and STP3. The stoppers STP1, STP2 and STP3 may be disposed under the light-transmitting film LT. In an embodiment, the stoppers STP1, STP2 and STP3 may be disposed under the first light-transmitting layer LT_L1, the second light-transmitting layer LT_L2 and the third light-transmitting layer LT_L3, respectively, for example.

The stoppers STP1, STP2 and STP3 may be features that prevent overflow of the light-transmitting film LT. In an embodiment, the end of the light-transmitting film LT may not be extended beyond the ends of the stoppers STP1, STP2 and STP3, for example. Specifically, the end of the light-transmitting film LT may coincide with the ends of the stoppers STP1, STP2 and STP3, or may be disposed further to the inside than the ends of the stoppers STP1, STP2 and STP3.

Due to changes in film quality caused by the breakage of the stoppers STP1, STP2 and STP3 at the ends of the stoppers STP1, STP2 and STP3 and the surface tension of the light-transmitting film LT itself, the end of the light-transmitting film LT disposed on the stoppers STP1, STP2 and STP3 may not be extended beyond the ends of the stoppers STP1, STP2 and STP3.

The stoppers STP1, STP2 and STP3 may include a first stopper STP1, a second stopper STP2, and a third stopper STP3.

The first stopper STP1 may be a portion of the bottom light-transmitting film OPVX. The first stopper STP1 may be an end of the bottom light-transmitting film OPVX adjacent to the light-transmitting film dams ODAM1 and ODAM2. The end of the first light-transmitting layer LT_L1 may be disposed on the first stopper STP1, and the first stopper STP1 may prevent overflow of the first light-transmitting layer LT_L1.

The end of the first light-transmitting layer LT_L1 may not be extended beyond the end of the first stopper STP1. The end of the first light-transmitting layer LT_L1 may coincide with the end of the first stopper STP1 or may be disposed further to the inside than the end of the first stopper STP1.

The second stopper STP2 may include the same material as that of the first light-shielding layer LS_L1 and may be disposed in the same layer. The second stopper STP2 may be formed via the same process as the first light-shielding layer LS_L1. The second stopper STP2 may be spaced apart from the plurality of patterns of the first light-shielding layer LS_L1. The end of the second light-transmitting layer LT_L2 may be disposed on the second stopper STP2, and the second stopper STP2 may prevent overflow of the second light-transmitting layer LT_L2.

The end of the second light-transmitting layer LT_L2 may not be extended beyond the end of the second stopper STP2. The end of the second light-transmitting layer LT_L2 may coincide with the end of the second stopper STP2 or may be disposed further to the inside than the end of the second stopper STP2.

In some embodiments, the second stopper STP2 may be disposed on the intermediate layer OLD and the first light-transmitting film dam ODAM1. The second stopper STP2 may overlap the first light-transmitting film dam ODAM1 in the third direction DR3. The second stopper STP2 may cover at least a portion of the upper surface and at least a portion of the side surface of the first light-transmitting film dam ODAM1.

The third stopper STP3 may include the same material as that of the second light-shielding layer LS_L2 and may be disposed in the same layer. The third stopper STP3 may be formed via the same process as the second light-shielding layer LS_L2. The third stopper STP3 may be spaced apart from the plurality of patterns of the second light-shielding layer LS_L2. The end of the third light-transmitting layer LT_L3 may be disposed on the third stopper STP3, and the third stopper STP3 may prevent overflow of the third light-transmitting layer LT_L3.

The end of the third light-transmitting layer LT_L3 may not be extended beyond the end of the third stopper STP3. The end of the third light-transmitting layer LT_L3 may coincide with the end of the third stopper STP3 or may be disposed further to the inside than the end of the third stopper STP3.

In some embodiments, the third stopper STP3 may be disposed on the intermediate layer OLD and the second light-transmitting film dam ODAM2. The third stopper STP3 may overlap the second light-transmitting film dam ODAM2 in the third direction DR3. The third stopper STP3 may cover at least a portion of the upper surface and at least a portion of the side surface of the second light-transmitting film dam ODAM2.

As the display device 10 according to this embodiment includes the first stopper STP1, the second stopper STP2 and the third stopper STP3 disposed under the first light-transmitting layer LT_L1, the second light-transmitting layer LT_L2 and the third light-transmitting layer LT_L3, it is possible to prevent overflow of the first light-transmitting layer LT_L1, the second light-transmitting layer LT_L2 and the third light-transmitting layer LT_L3 when the first light-transmitting layer LT_L1, the second light-transmitting layer LT_L2 and the third light-transmitting layer LT_L3 via an inkjet printing process.

As the number of light-shielding layers included in the light-shielding film LS increases and the thickness of the overall light control layer LCL increases, the viewing angle may be more effectively controlled. Accordingly, the number of light-transmitting layers included in the light-transmitting film LT may also increase.

The display device 10 according to this embodiment includes the stoppers STP1, STP2 and STP3 to prevent overflow of each light-transmitting layer included in the light-transmitting film LT, where the first stopper STP1 is formed as a portion of the bottom light-transmitting film OPVX, the second stopper STP2 is formed in the same process as the first light-shielding layer LS_L1, and the third stopper STP3 is formed in the same process as the second light-shielding layer LS_L2, so that the process may be simplified.

Hereinafter, display devices according to other embodiments of the disclosure will be described. In the following description, the same or similar elements will be denoted by the same or similar reference numerals, and redundant descriptions will be omitted or briefly described.

Figure 9:
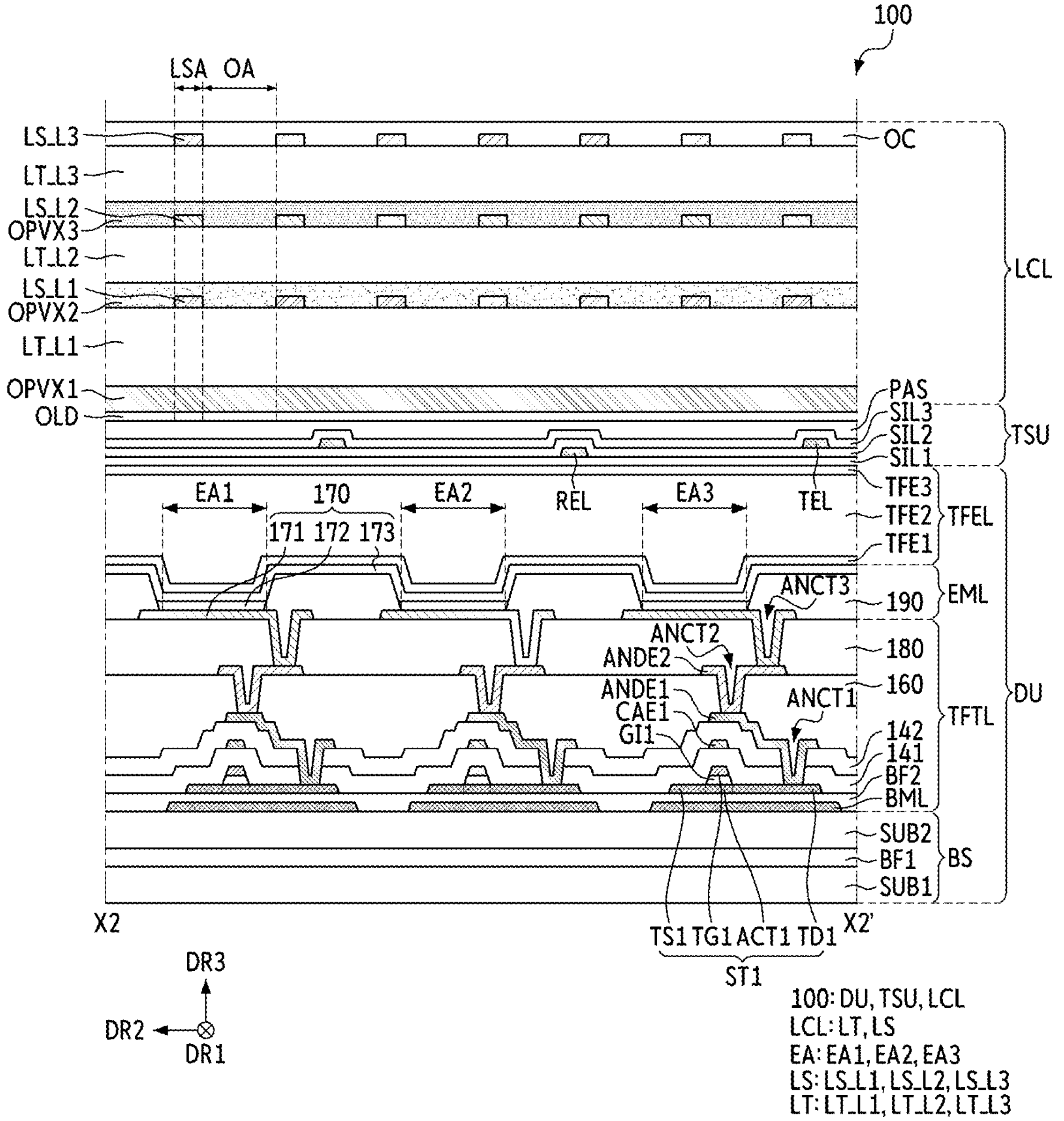
FIG. 9 is a cross-sectional view showing another embodiment of a display area of a display panel according to the disclosure.
Figure 10:
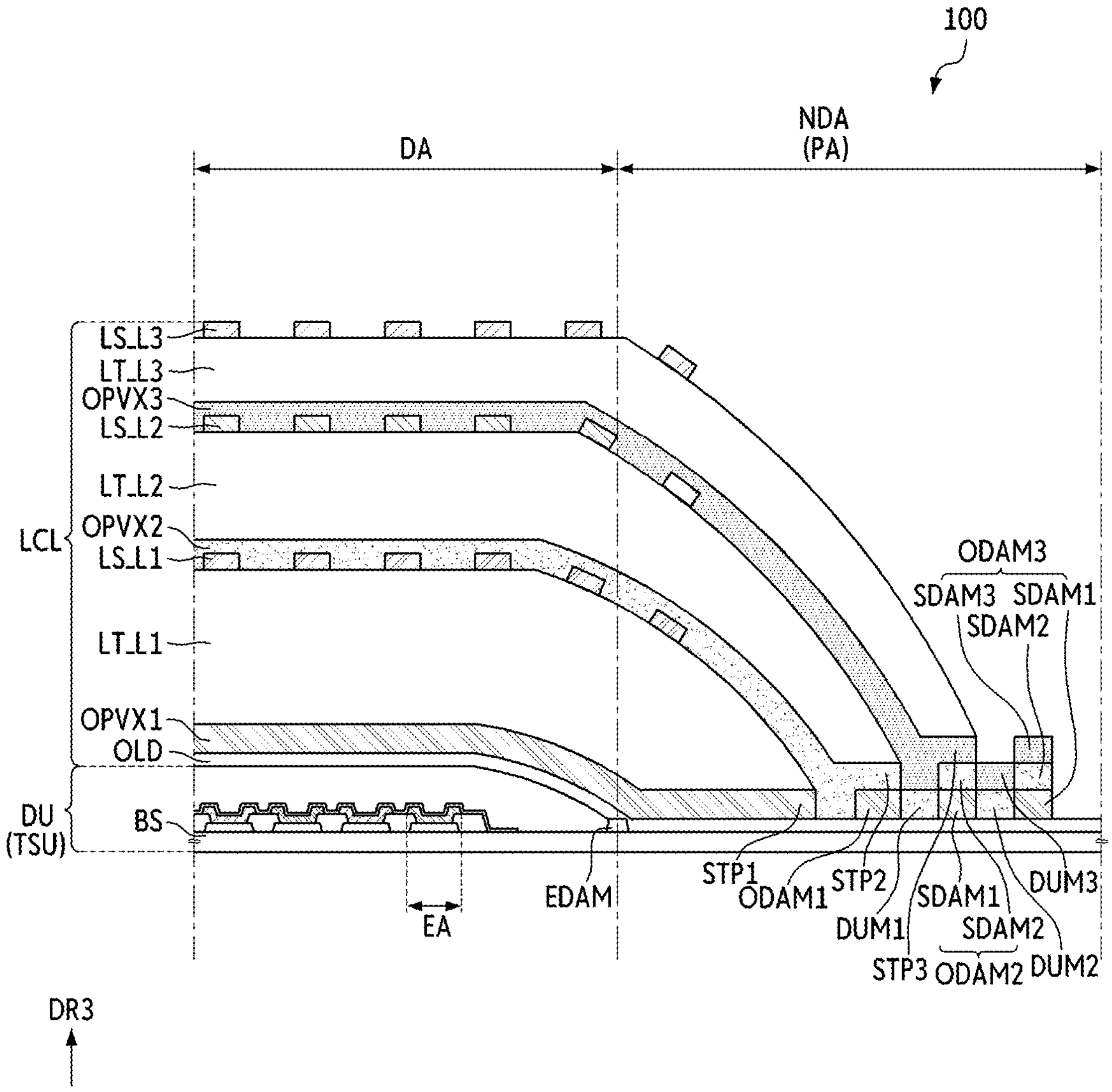
FIG. 10 is a cross-sectional view showing another embodiment of a display area, a non-display area, and a protruding area of a display panel.

FIG. 9 is a cross-sectional view showing another embodiment of a display area of a display panel according to the disclosure. FIG. 10 is a cross-sectional view showing another embodiment of a display area, a non-display area, and a protruding area of a display panel.

A display device 10 in the embodiment of FIGS. 9 and 10 is different from the display device 10 according to the above-described embodiment of FIG. 7 or the like in that the former includes a first bottom light-transmitting film OPVX1, a second bottom light-transmitting film OPVX2 and a third bottom light-transmitting film OPVX3.

More specifically, the first bottom light-transmitting film OPVX1 is substantially identical to the bottom light-transmitting film OPVX described above with reference to FIGS. 7 and 8; and, therefore, the redundant descriptions will be omitted.

The second bottom light-transmitting film OPVX2 may be disposed on the first light-transmitting layer LT_L1 and the first light-shielding layer LS_L1. The second bottom light-transmitting film OPVX2 may be disposed between the first light-transmitting layer LT_L1 and the second light-transmitting layer LT_L2 and between the first light-shielding layer LS_L1 and the second light-transmitting layer LT_L2.

The third bottom light-transmitting film OPVX3 may be disposed on the second light-transmitting layer LT_L2 and the second light-shielding layer LS_L2. The third bottom light-transmitting film OPVX3 may be disposed between the second light-transmitting layer LT_L2 and the third light-transmitting layer LT_L3 and between the second light-shielding layer LS_L2 and the third light-transmitting layer LT_L3.

Each of the second bottom light-transmitting film OPVX2 and the third bottom light-transmitting film OPVX3 may include the same material as that of the first bottom light-transmitting film OPVX1. That is to say, the second bottom light-transmitting film OPVX2 and the third bottom light-transmitting film OPVX3 may include the same material as that of the bottom light-transmitting film OPVX described above with reference to FIGS. 7 and 8.

The first bottom light-transmitting film OPVX1, the second bottom light-transmitting film OPVX2 and the third bottom light-transmitting film OPVX3 may be extended not only to the display area DA but also to the non-display area NDA or the protruding area PA.

In some embodiments, one end of the intermediate layer OLD may be extended further toward the non-display area NDA or the protruding area PA from the display area DA than one end of each of the bottom light-transmitting film OPVX1, the second bottom light-transmitting film OPVX2 and the third bottom light-transmitting film OPVX3. That is to say, the end of each of the bottom light-transmitting film OPVX1, the second bottom light-transmitting film OPVX2 and the third bottom light-transmitting film OPVX3 may be disposed closer to the display area DA than the end of the intermediate layer OLD. The end of each of the bottom light-transmitting film OPVX1, the second bottom light-transmitting film OPVX2 and the third bottom light-transmitting film OPVX3 may be disposed closer to the encapsulation dam EDAM to be described later than the end of the intermediate layer OLD.

The end of the third bottom light-transmitting film OPVX3 may be extended further toward the non-display area NDA or the protruding area PA from the display area DA than the end of the second bottom light-transmitting film OPVX2, and the end of the second bottom light-transmitting film OPVX2 may be extended further toward the non-display area NDA or the protruding area PA from the display area DA than the end of the first bottom light-transmitting film OPVX1. Specifically, the end of the first bottom light-transmitting film OPVX1 may be disposed closer to the display area DA than the end of the second bottom light-transmitting film OPVX2, and the end of the second bottom light-transmitting film OPVX2 may be disposed closer to the display area DA than the end of the third bottom light-transmitting film OPVX3.

The display panel 100 may include a first light-transmitting film dam ODAM1, a second light-transmitting film dam ODAM2, a third light-transmitting film dam ODAM3 and first to third dummies DUM1, DUM2 and DUM3.

The encapsulation dam EDAM may be disposed further to the inside of the display panel 100 than the first light-transmitting film dam ODAM1, the second light-transmitting film dam ODAM2, the third light-transmitting film dam ODAM3 and the first to third dummies DUM1, DUM2 and DUM3. In an embodiment, the encapsulation dam EDAM may be disposed closer to the display area DA than the first light-transmitting film dam ODAM1, the second light-transmitting film dam ODAM2, the third light-transmitting film dam ODAM3 and the first to third dummies DUM1, DUM2 and DUM3, for example.

Although the encapsulation dam EDAM is disposed in the display area DA and the non-display area NDA, and the first light-transmitting film dam ODAM1, the second light-transmitting film dam ODAM2, the third light-transmitting film dam ODAM3 and the first to third dummies DUM1, DUM2 and DUM3 are disposed in the non-display area NDA or the protruding area PA in the drawings, the disclosure is not limited thereto. In another embodiment, the encapsulation dam EDAM, the first light-transmitting film dam ODAM1, the second light-transmitting film dam ODAM2, the third light-transmitting film dam ODAM3, and the first to third dummies DUM1, DUM2 and DUM3 may all be disposed in the non-display area NDA or the protruding area PA, or may all be disposed in the display area DA.

The first light-transmitting film dam ODAM1, the second light-transmitting film dam ODAM2, the third light-transmitting film dam ODAM3 and the first to third dummies DUM1, DUM2 and DUM3 may be disposed further to the outside of the display panel 100 than the encapsulation dam EDAM. In an embodiment, the first light-transmitting film dam ODAM1, the second light-transmitting film dam ODAM2, the third light-transmitting film dam ODAM3 and the first to third dummies DUM1, DUM2 and DUM3 may be disposed closer to the non-display area NDA or the protruding area PA than the encapsulation dam EDAM, for example.

The first light-transmitting film dam ODAM1 may be disposed further to the outside than the end of the first bottom light-transmitting film OPVX1. In an embodiment, the first light-transmitting film dam ODAM1 may be disposed closer to the non-display area NDA or the protruding area PA than the end of the first bottom light-transmitting film OPVX1, for example.

The second light-transmitting film dam ODAM2 and the first dummy DUM1 may be disposed further to the outside than the end of the second bottom light-transmitting film OPVX2. In an embodiment, the second light-transmitting film dam ODAM2 and the first dummy DUM1 may be disposed closer to the non-display area NDA or the protruding area PA than the end of the second bottom light-transmitting film OPVX2, for example.

The third light-transmitting film dam ODAM3, the second dummy DUM2 and the third dummy DUM3 may be disposed further to the outside than the end of the third bottom light-transmitting film OPVX3. In an embodiment, the third light-transmitting film dam ODAM3, the second dummy DUM2 and the third dummy DUM3 may be disposed closer to the non-display area NDA or the protruding area PA than the end of the third bottom light-transmitting film OPVX3, for example.

In the direction from the display area DA to the non-display area NDA (or the protruding area PA), the end of the first bottom light-transmitting film OPVX1, the first light-transmitting film dam ODAM1, the first dummy DUM1, the second light-transmitting film dam ODAM2, the second dummy DUM2 (or the third dummy DUM3), and the third light-transmitting film dam ODAM3 may be arranged in this order.

Although the end of the first bottom light-transmitting film OPVX1, the first light-transmitting film dam ODAM1, the second light-transmitting film dam ODAM2, the third light-transmitting film dam ODAM3, and the first to third dummies DUM1, DUM2 and DUM3 contact one another in the drawings, the disclosure is not limited thereto. They may be spaced apart from one another.

The second light-transmitting film dam ODAM2 may include a first sub-dam SDAM1 and a second sub-dam SDAM2. The third light-transmitting film dam ODAM3 may include a first sub-dam SDAM1, a second sub-dam SDAM2, and a third sub-dam SDAM3.

The second sub-dam SDAM2 of the second light-transmitting film dam ODAM2 may be disposed on the first sub-dam SDAM1 of the second light-transmitting film dam ODAM2. The third sub-dam SDAM3 of the third light-transmitting film dam ODAM3 may be disposed on the second sub-dam SDAM2 of the third light-transmitting film dam ODAM3, and the second sub-dam SDAM2 of the third light-transmitting film dam ODAM3 may be disposed on the first sub-dam SDAM1 of the third light-transmitting film dam ODAM3.

The first light-transmitting film dam ODAM1, the first sub-dam SDAM1 of the second light-transmitting film dam ODAM2 and the first sub-dam SDAM1 of the third light-transmitting film dam ODAM3 may include the same material as that of the first bottom light-transmitting film OPVX1, may be disposed in the same layer, and may be formed together via the same process.

The second sub-dam SDAM2 of the second light-transmitting film dam ODAM2, the second sub-dam SDAM2 of the third light-transmitting film dam ODAM3, the first dummy DUM1 and the second dummy DUM2 may include the same material as that of the second bottom light-transmitting film OPVX2, may be disposed in the same layer, and may be formed together via the same process.

The third sub-dam SDAM3 of the third light-transmitting film dam ODAM3 and the third dummy DUM3 may include the same material as that of the third bottom light-transmitting film OPVX3, may be disposed in the same layer, and may be formed via the same process.

According to this embodiment, the display device 10 may include stoppers STP1, STP2 and STP3. The stoppers STP1, STP2 and STP3 may be disposed under the light-transmitting film LT. In an embodiment, the stoppers STP1, STP2 and STP3 may be disposed under the first light-transmitting layer LT_L1, the second light-transmitting layer LT_L2 and the third light-transmitting layer LT_L3, respectively, for example.

The stoppers STP1, STP2 and STP3 may be features that prevent overflow of the light-transmitting film LT. In an embodiment, the end of the light-transmitting film LT may not be extended beyond the ends of the stoppers STP1, STP2 and STP3, for example. Specifically, the end of the light-transmitting film LT may coincide with the ends of the stoppers STP1, STP2 and STP3, or may be disposed further to the inside than the ends of the stoppers STP1, STP2 and STP3.

The stoppers STP1, STP2 and STP3 may include a first stopper STP1, a second stopper STP2, and a third stopper STP3.

The first stopper STP1 may be a portion of the first bottom light-transmitting film OPVX1. The first stopper STP1 may be an end of the first bottom light-transmitting film OPVX1 adjacent to the first light-transmitting film dam ODAM1. The end of the first light-transmitting layer LT_L1 may be disposed on the first stopper STP1, and the first stopper STP1 may prevent overflow of the first light-transmitting layer LT_L1.

The end of the first light-transmitting layer LT_L1 may not be extended beyond the end of the first stopper STP1. The end of the first light-transmitting layer LT_L1 may coincide with the end of the first stopper STP1 or may be disposed further to the inside than the end of the first stopper STP1.

The second stopper STP2 may be a portion of the second bottom light-transmitting film OPVX2. The second stopper STP2 may be an end of the second bottom light-transmitting film OPVX2 adjacent to the second light-transmitting film dam ODAM2. The end of the second light-transmitting layer LT_L2 may be disposed on the second stopper STP2, and the second stopper STP2 may prevent overflow of the second light-transmitting layer LT_L2.

The end of the second light-transmitting layer LT_L2 may not be extended beyond the end of the second stopper STP2. The end of the second light-transmitting layer LT_L2 may coincide with the end of the second stopper STP2 or may be disposed further to the inside than the end of the second stopper STP2.

In some embodiments, the second stopper STP2 may be disposed on the intermediate layer OLD and the first light-transmitting film dam ODAM1. The second stopper STP2 may overlap the first light-transmitting film dam ODAM1 in the third direction DR3. The second stopper STP2 may cover at least a portion of the upper surface and at least a portion of the side surface of the first light-transmitting film dam ODAM1.

The third stopper STP3 may be a portion of the third bottom light-transmitting film OPVX3. The third stopper STP3 may be an end of the third bottom light-transmitting film OPVX3 adjacent to the third light-transmitting film dam ODAM3. The end of the third light-transmitting layer LT_L3 may be disposed on the third stopper STP3, and the third stopper STP3 may prevent overflow of the third light-transmitting layer LT_L3.

The end of the third light-transmitting layer LT_L3 may not be extended beyond the end of the third stopper STP3. The end of the third light-transmitting layer LT_L3 may coincide with the end of the third stopper STP3 or may be disposed further to the inside than the end of the third stopper STP3.

In some embodiments, the third stopper STP3 may be disposed on the intermediate layer OLD and the second light-transmitting film dam ODAM2. The third stopper STP3 may overlap the second light-transmitting film dam ODAM2 in the third direction DR3. The third stopper STP3 may cover at least a portion of the upper surface and at least a portion of the side surface of the second light-transmitting film dam ODAM2.

As the display device 10 according to this embodiment includes the first stopper STP1, the second stopper STP2 and the third stopper STP3 disposed under the first light-transmitting layer LT_L1, the second light-transmitting layer LT_L2 and the third light-transmitting layer LT_L3, it is possible to prevent overflow of the first light-transmitting layer LT_L1, the second light-transmitting layer LT_L2 and the third light-transmitting layer LT_L3 when the first light-transmitting layer LT_L1, the second light-transmitting layer LT_L2 and the third light-transmitting layer LT_L3 via an inkjet printing process.

The display device 10 according to this embodiment includes the stoppers STP1, STP2 and STP3 to prevent overflow of each light-transmitting layer included in the light-transmitting film LT, where the first stopper STP1, the second stopper STP2 and the third stopper STP3 are formed as parts of the first bottom light-transmitting film OPVX1, the second bottom light-transmitting film OPVX2 and the third bottom light-transmitting film OPVX3, respectively, so that the process may be simplified.

Figure 11:
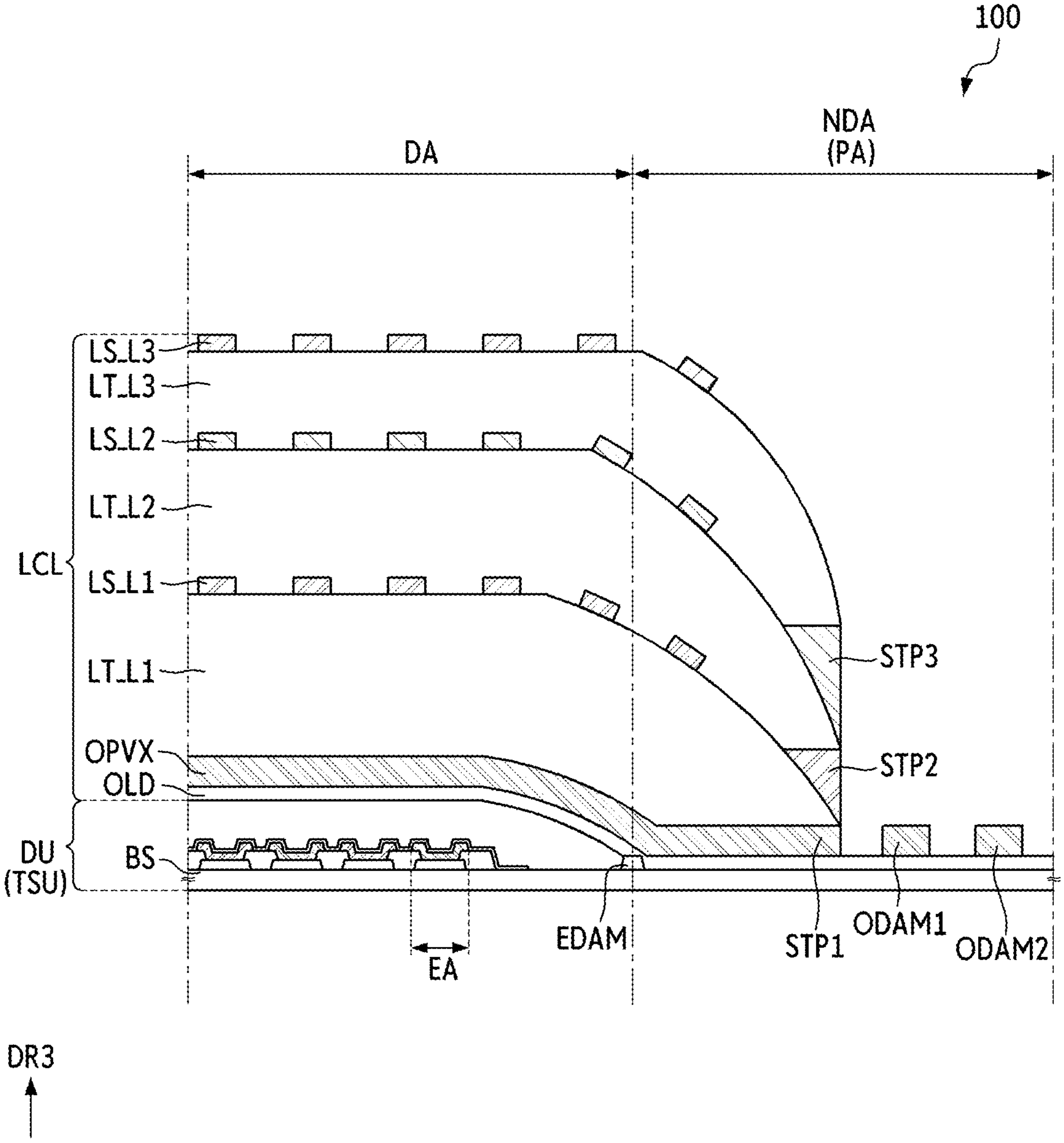
FIG. 11 is a cross-sectional view showing another embodiment of a display area, a non-display area, and a protruding area of a display panel.

FIG. 11 is a cross-sectional view showing another embodiment of a display area, a non-display area, and a protruding area of a display panel.

A display device 10 in the embodiment of FIG. 11 is different from the display device 10 in the embodiment of FIG. 8 or the like in that a second stopper STP2 and a third stopper STP3 have different positions and shapes.

More specifically, the second stopper STP2 and the third stopper STP3, like in the display device 10 in the embodiment described above with reference to FIG. 8 or the like, may include the same material as that of the first light-shielding layer LS_L1 and the second light-shielding layer LS_L2, respectively, may be disposed in the same layer, and may be formed via the same process.

A display device 10 according to this embodiment is different from the display device 10 in the embodiment of FIG. 8 or the like in that a second stopper STP2 and a third stopper STP3 may be disposed further to the inside than light-transmitting film dams ODAM1 and ODAM2.

The second stopper STP2 and the third stopper STP3 may not overlap the light-transmitting film dams ODAM1 and ODAM2 in the third direction DR3. In some embodiments, the outer boundary of the end of each of the second stopper STP2 and the third stopper STP3 may coincide with the outer boundary of the end of the first stopper STP1. It should be understood, however, that the embodiments of the disclosure are not limited thereto. The outer boundary of the end of each of the second stopper STP2 and the third stopper STP3 may be disposed further to the inside than the outer boundary of the end of the first stopper STP1.

In the display device 10 according to this embodiment, the second stopper STP2 and the third stopper STP3 may be disposed further to the inside than the light-transmitting film dams ODAM1 and ODAM2, so that the size of the non-display area NDA or the protruding area PA may be reduced. Accordingly, the size of a dead space may be reduced.

Figure 12:
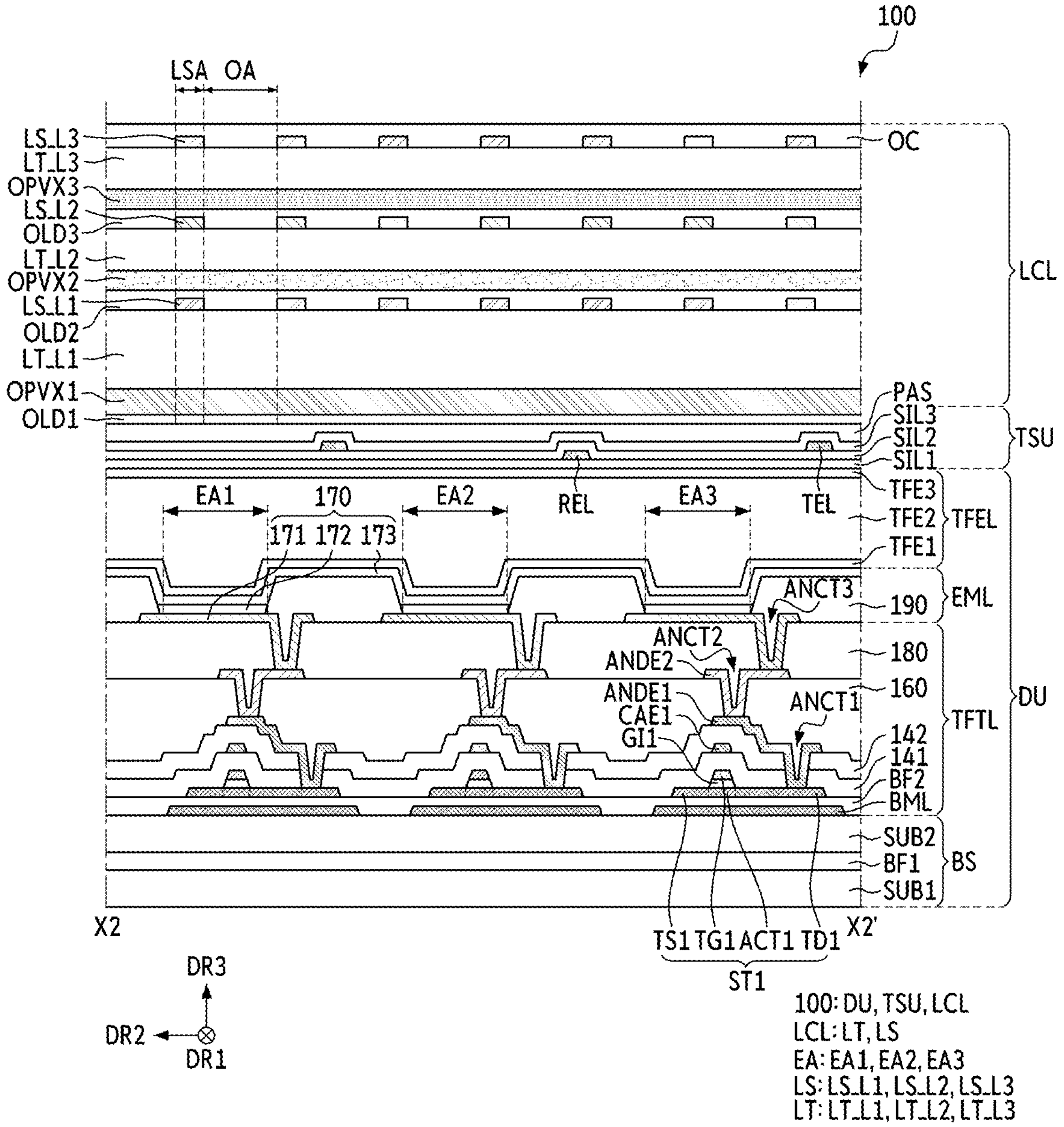
FIG. 12 is a cross-sectional view showing another embodiment of a display area of a display panel according to the disclosure.

FIG. 12 is a cross-sectional view showing another embodiment of a display area of a display panel according to the disclosure.

A display device 10 in the embodiment of FIG. 12 is different from the display devices in the embodiments described above with reference to FIGS. 7, 9 or the like in that the former further includes a first intermediate layer OLD1, a second intermediate layer OLD2 and a third intermediate layer OLD3.

More specifically, the display device 10 according to this embodiment may include a first bottom light-transmitting film OPVX1, a second bottom light-transmitting film OPVX2 and a third bottom light-transmitting film OPVX3, like the display device 10 described above with reference to FIG. 9.

It should be noted that the display device 10 according to this embodiment, unlike the display device 10 described with reference to FIG. 9, may further include a first intermediate layer OLD1, a second intermediate layer OLD2, and a third intermediate layer OLD3.

The first intermediate layer OLD1 is substantially identical to the intermediate layer OLD described above with reference to FIGS. 7 and 9; and, therefore, the redundant descriptions will be omitted.

The second intermediate layer OLD2 may be disposed on a first light-transmitting layer LT_L1 and a first light-shielding layer LS_L1. The second intermediate layer OLD2 may be disposed between the first light-transmitting layer LT_L1 and the second bottom light-transmitting film OPVX2 and between the first light-shielding layer LS_L1 and the second bottom light-transmitting film OPVX2.

The third intermediate layer OLD3 may be disposed on a second light-transmitting layer LT_L2 and a second light-shielding layer LS_L2. The third intermediate layer OLD3 may be disposed between the second light-transmitting layer LT_L2 and the third bottom light-transmitting film OPVX3 and between the second light-shielding layer LS_L2 and the third bottom light-transmitting film OPVX3.

In the display device 10 according to this embodiment, the first intermediate layer OLD1 is disposed between the planarization film PAS and the first bottom light-transmitting film OPVX1, the second intermediate layer OLD2 is disposed between the first light-transmitting layer (also referred to as a first transparent layer) LT_L1 and the second bottom light-transmitting film OPVX2, and the third intermediate layer OLD3 is disposed between the second light-transmitting layer LT_L2 and the third bottom light-transmitting film OPVX3, and accordingly the interfacial properties may be increased so that the first to third bottom light-transmitting films OPVX1, OPVX2 and OPVX3 may be easily deposited on organic films such as the planarization film PAS, the first light-transmitting layer LT_L1 and the second light-transmitting layer LT_L2 during the deposition process of the first to third bottom light-transmitting films OPVX1, OPVX2 and OPVX3.

In concluding the detailed description, those skilled in the art will appreciate that many variations and modifications may be made to the preferred embodiments without substantially departing from the principles of the disclosure. Therefore, the disclosed preferred embodiments of the invention are used in a generic and descriptive sense only and not for purposes of limitation.

What is claimed is:

1. A display device comprising:
a substrate;
an emission material layer disposed on the substrate and comprising:
a plurality of light-emitting elements; and
a light control layer disposed on the emission material layer, the light control layer comprising:
a bottom light-transmitting film disposed on the emission material layer;
a first light-transmitting layer disposed on the bottom light-transmitting film; and
a first light-shielding layer disposed on the first light-transmitting layer and comprising:
a plurality of light-shielding patterns spaced apart from one another,
wherein an end of the first light-transmitting layer coincides with an end of the bottom light-transmitting film or is disposed further to inside than the end of the bottom light-transmitting film.

2. The display device of claim 1, wherein the end of the first light-transmitting layer does not further protrude outward than the end of the bottom light-transmitting film.

3. The display device of claim 1, further comprising:
a second light-transmitting layer disposed on the first light-shielding layer;
a second light-shielding layer disposed on the second light-transmitting layer and comprising a plurality of light-shielding patterns spaced apart from one another; and
a first stopper disposed under at least a portion of the second light-transmitting layer and spaced apart from the plurality of light-shielding patterns,
wherein an end of the second light-transmitting layer coincides with an end of the first stopper or is disposed further to inside than the end of the first stopper.

4. The display device of claim 3, wherein the end of the second light-transmitting layer further protrudes outward than the end of the first light-transmitting layer.

5. The display device of claim 3, wherein the end of the second light-transmitting layer does not further protrude outward than the end of the first stopper.

6. The display device of claim 3, wherein the first stopper comprises a same material as a material of the second light-shielding layer.

7. The display device of claim 3, further comprising:
a light-transmitting film dam spaced apart from the end of the bottom light-transmitting film and comprising a same material as a material of the bottom light-transmitting film.

8. The display device of claim 7, wherein the first stopper overlaps at least a portion of the light-transmitting film dam.

9. The display device of claim 7, wherein the first stopper is disposed further to inside than the light-transmitting film dam.

10. The display device of claim 9, wherein the first stopper does not overlap with the light-transmitting film dam.

11. The display device of claim 9, wherein an outer boundary of the end of the first stopper coincides with an outer boundary of the end of the bottom light-transmitting film.

12. The display device of claim 1, further comprising:
an intermediate layer disposed under the bottom light-transmitting film, wherein the intermediate layer includes an inorganic material.

13. The display device of claim 1, further comprising:
an encapsulation dam disposed under the bottom light-transmitting film.

14. A display device comprising:
a substrate;
an emission material layer disposed on the substrate and comprising:
a plurality of light-emitting elements; and
a light control layer disposed on the emission material layer, the light control layer comprising:
a first bottom light-transmitting film disposed on the emission material layer;
a first light-transmitting layer disposed on the first bottom light-transmitting film;
a first light-shielding layer disposed on the first light-transmitting layer and comprising:

a plurality of light-shielding patterns spaced apart from one another;

a second bottom light-transmitting film disposed on the first light-shielding layer;

a second light-transmitting layer disposed on the second bottom light-transmitting film; and a second light-shielding layer disposed on the second light-transmitting layer and comprising:

a plurality of light-shielding patterns spaced apart from one another, wherein an end of the first light-transmitting layer coincides with an end of the first bottom light-transmitting film or is disposed further to inside than the end of the first bottom light-transmitting film, and wherein an end of the second light-transmitting layer coincides with an end of the second bottom light-transmitting film or is disposed further to inside than the end of the second bottom light-transmitting film.

15. The display device of claim 14, wherein the end of the first light-transmitting layer does not further protrude outward than the end of the first bottom light-transmitting film, and wherein the end of the second light-transmitting layer does not further protrude outward than the end of the second bottom light-transmitting film.

16. The display device of claim 15, further comprising:

a first light-transmitting film dam spaced apart from one side of the end of the first bottom light-transmitting film; and a second light-transmitting film dam spaced apart from one side of the first light-transmitting film dam, wherein the second light-transmitting film dam comprises a first sub-dam and a second sub-dam disposed on the first sub-dam, wherein the first light-transmitting film dam and the first sub-dam of the second light-transmitting film dam comprise a same material as a material of the first bottom light-transmitting film, and wherein the second sub-dam of the second light-transmitting film dam comprises a same material as a material of the second bottom light-transmitting film.

17. The display device of claim 16, further comprising:

a first dummy disposed between the first light-transmitting film dam and the second light-transmitting film dam, wherein the first dummy comprises a same material as the material of the second bottom light-transmitting film.

18. The display device of claim 16, wherein the second bottom light-transmitting film overlaps at least a portion of the first light-transmitting film dam.

19. The display device of claim 14, further comprising:

a first intermediate layer disposed under the first bottom light-transmitting film; and a second intermediate layer disposed between the second bottom light-transmitting film and the first light-transmitting layer, wherein the first intermediate layer and the second intermediate layer comprise an inorganic material.

20. The display device of claim 14, further comprising:

an encapsulation dam disposed under the bottom light-transmitting film.

* * * * *